(12) United States Patent
Yoshida et al.

(10) Patent No.: US 11,099,442 B2
(45) Date of Patent: Aug. 24, 2021

(54) DISPLAY DEVICE

(71) Applicant: Sharp Kabushiki Kaisha, Sakai (JP)

(72) Inventors: Masahiro Yoshida, Sakai (JP); Masakatsu Tominaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/912,749

(22) Filed: Jun. 26, 2020

(65) Prior Publication Data
US 2021/0003896 A1 Jan. 7, 2021

Related U.S. Application Data

(60) Provisional application No. 62/869,085, filed on Jul. 1, 2019.

(51) Int. Cl.
*G02F 1/1362* (2006.01)
*H01L 27/12* (2006.01)
*H01L 27/32* (2006.01)

(52) U.S. Cl.
CPC .... *G02F 1/136286* (2013.01); *H01L 27/1251* (2013.01); *H01L 27/326* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2009/0102758 A1* | 4/2009 | Anzai | G09G 3/2096 345/76 |
| 2010/0156945 A1* | 6/2010 | Yoshida | G02F 1/1345 345/690 |
| 2014/0375922 A1* | 12/2014 | Park | G02F 1/136286 349/46 |
| 2015/0301420 A1* | 10/2015 | Yoshida | H01L 27/1225 257/43 |
| 2017/0199441 A1* | 7/2017 | Um | G02F 1/136286 |
| 2017/0322446 A1* | 11/2017 | Tae | G02F 1/134309 |
| 2018/0366066 A1* | 12/2018 | Kim | G09G 3/3677 |
| 2019/0096914 A1* | 3/2019 | Hosokawa | G02F 1/136286 |
| 2019/0393295 A1* | 12/2019 | Moy | H01L 27/3279 |
| 2020/0358028 A1* | 11/2020 | Hwang | H01L 51/56 |

FOREIGN PATENT DOCUMENTS

JP 10-253987 A 9/1989

\* cited by examiner

*Primary Examiner* — Ryan Crockett
(74) *Attorney, Agent, or Firm* — Keating & Bennett, LLP

(57) ABSTRACT

A display device includes: a signal supply portion; a substrate having an extended outer shape portion, the substrate including a first region and a second region that has the extended outer shape portion; a first pixel wire connected to a first pixel in the first region in a display region and the signal supply portion; a second pixel wire connected to a second pixel in the second region in the display region; a relay wire disposed in the first region in the display region; a signal-supply-portion-side lead wire connected to the signal supply portion and an end portion of the relay wire, the end portion being at the signal supply portion side; and an opposite-side lead wire connected to end portions of the relay wire and the second pixel wire, the end portions being at an opposite side to the signal supply portion side.

15 Claims, 25 Drawing Sheets

DISPLAY DEVICE

CROSS-REFERENCE TO RELATED APPLICATION

The present application claims priority from Provisional Application No. 62/869,085, the content to which is hereby incorporated by reference into this application.

BACKGROUND OF THE INVENTION

1. Field of the Invention

The present invention relates to a display device.

2. Description of the Related Art

Heretofore, Japanese Unexamined Patent Application Publication No. 10-253987 described below has been known as one example of display devices. In the liquid-crystal display device disclosed in Japanese Unexamined Patent Application Publication No. 10-253987, a plurality of data lines is formed for one column of pixel electrodes, or a pixel electrode group is segmented into a plurality of regions, independent data drive circuits are connected thereto, and further a gate drive circuit puts the pixel electrodes in some rows into writing states at the same time, thereby increasing the writing time of data signals to the pixel electrodes.

SUMMARY OF INVENTION

According to the liquid-crystal display device described in Japanese Unexamined Patent Application Publication No. 10-253987 noted above, pixel-voltage charging insufficiency involved in an increase in the number of pixels and an increase in the screen size is eliminated to obtain favorable uniform display. Meanwhile, although Japanese Unexamined Patent Application Publication No. 10-253987 discloses a liquid-crystal display device in which the plane shape of a display region in which the pixel electrodes and so on are disposed is a rectangular shape, there are cases in which the plane shape of a display region is a non-rectangular shape. For example, in a liquid-crystal panel in which a data drive circuit is disposed at only one side for a data line group and that has extended outer shape portions whose width is increased as the distance from the data drive circuit increases, portions of lead wires for connecting the data lines to the data drive circuit are disposed between the display region and the outer edges of the extended outer shape portions. The lead wires are routed along the outer edges of the extended outer shape portions, the routing paths tend to become complicated, and thus, when the frame width between the display region and the outer edges of the extended outer shape portions decreases, and the wiring density increases, failures, such as short-circuiting, tend to be more likely to occur. In addition, since there are also cases in which a gate drive circuit, in addition to the above-described lead wires, is disposed between the display region and the outer edges of the extended outer shape portions, the wiring density of the lead wires and the gate drive circuit tends to increase, and thus failures, such as short-circuiting, are more likely to occur. When an attempt is made to reduce the wiring density, a problem that the frame width between the display region and the outer edges of the extended outer shape portions increases arises.

An aspect of the present invention has been completed based on a situation as described above, and an object thereof is to achieve a reduction in a frame width while suppressing an increase in a wiring density.

(1) One embodiment of the present invention is a display device comprising: a signal supply portion that supplies a signal; a substrate having an extended outer shape portion whose width increases as a distance from the signal supply portion increases, the substrate including a first region and a second region that is disposed so as to be neighboring to the first region and that has the extended outer shape portion; a display region that is disposed at the substrate so as to lie across the first region and the second region and that displays an image; a first pixel disposed in the first region in the display region; a second pixel disposed in the second region in the display region; a first pixel wire disposed in the first region in the display region and connected to the first pixel and the signal supply portion; a second pixel wire disposed in the second region in the display region and connected to the second pixel; a relay wire disposed in the first region in the display region, a signal-supply-portion-side lead wire connected to the signal supply portion and an end portion of the relay wire, the end portion being at the signal supply portion side; and an opposite-side lead wire connected to end portions of the relay wire and the second pixel wire, the end portions being at an opposite side to the signal supply portion side.

(2) Also, one embodiment of the present invention is a display device in which, in addition to the configuration in (1) described above, the relay wire is disposed so as to overlap the first pixel wire via an insulating film.

(3) Also, one embodiment of the present invention is a display device in which, in addition to the configuration (1) or (2) described above, the second pixel wire is constituted by a main pixel wire part and a sub pixel wire part, the main pixel wire part being connected to the second pixel, and the sub pixel wire part being disposed so as to overlap the main pixel wire part via an insulating film and being connected to the main pixel wire part.

(4) Also, one embodiment of the present invention is a display device in which, in addition to the configuration in (3) described above, the first pixel wire is disposed in a same layer as a layer of the main pixel wire part, whereas the relay wire is disposed in a same layer as a layer of the sub pixel wire part and is disposed so as to overlap the first pixel wire via an insulating film.

(5) Also, one embodiment of the present invention is a display device in which, in addition to the configuration in (3) or (4) described above, in the second pixel wire, end portions of the main pixel wire part and the sub pixel wire part are disposed outside the display region and are also connected to each other through a contact hole opened and formed in an insulating film.

(6) Also, one embodiment of the present invention is a display device in which, in addition to the configuration in (3) or (4) described above, in the second pixel wire, portions of the main pixel wire part and the sub pixel wire part, the portions being neighboring to the second pixel, are connected to each other through a contact hole opened and formed in an insulating film.

(7) Also, one embodiment of the present invention is a display device in which, in addition to the configuration in (6) described above, the second pixel wire has an increased-width part at a position where the main pixel wire part and the sub pixel wire part overlap the contact hole; and the first pixel wire has a dummy increased-width part whose width is same as a width of the increased-width part.

(8) Also, one embodiment of the present invention is a display device in which, in addition to one of the configurations in (1) to (7) described above, the first region is segmented into a middle region that is neighboring to the second region and an opposite-side region that is disposed at an opposite side to the second region side so that the opposite-side region and the second region sandwich the middle region, and the relay wire is selectively disposed in the middle region.

(9) Also, one embodiment of the present invention is a display device in which, in addition to the configuration in (8) described above, the relay wire is disposed so as to overlap the first pixel wire via an insulating film; and the display device comprises a dummy wire that is selectively disposed in the opposite-side region in the display region and that is disposed so as to overlap the first pixel wire via an insulating film.

(10) Also, one embodiment of the present invention is a display device in which, in addition to the configuration in (9) described above, a constant potential is supplied to the dummy wire.

(11) Also, one embodiment of the present invention is a display device in which, in addition to the configuration in (10) described above, the number of dummy wires disposed in the opposite-side region is two or more, and end portions of each dummy wire are disposed outside the display region; and the display device comprises a short-circuit wire that is positioned between the display region and an outer edge of the substrate, that is disposed so as to overlap respective end portions of the dummy wires via an insulating film, and that is also connected to the dummy wires through short-circuit contact holes opened and formed in the insulating film.

(12) Also, one embodiment of the present invention is a display device in which, in addition to one of the configurations in (1) to (11) described above, the numbers of first pixel wires, second pixel wires, relay wires, signal-supply-portion-side lead wires, and opposite-side lead wires that are disposed are each two or more; and the opposite-side lead wires include first opposite-side lead wires and second opposite-side lead wires that are disposed in a layer different from the first opposite-side lead wires via an insulating film and that are disposed so as to be neighboring to the first opposite-side lead wires.

(13) Also, one embodiment of the present invention is a display device in which, in addition to the configuration in (12) described above, the relay wires are disposed so as to overlap the first pixel wire via an insulating film; and the first opposite-side lead wires and the second opposite-side lead wires are disposed in same layers as layers of the relay wires and the first pixel wires.

(14) Also, one embodiment of the present invention is a display device in which, in addition to the configuration in (12) or (13) described above, the numbers of second pixels that are disposed are two or more, the second pixel wires are constituted by main pixel wire parts and sub pixel wire parts, the main pixel wire parts being connected to the second pixels, and the sub pixel wire parts being disposed so as to overlap the main pixel wire parts via an insulating film and being connected to the main pixel wire parts; and the first opposite-side lead wires and the second opposite-side lead wires are disposed in same layers as layers of the sub pixel wire parts and the main pixel wire parts, respectively.

(15) Also, one embodiment of the present invention is a display device in which, in addition to one of the configurations in (1) to (14) described above, a pixel driving portion disposed at the substrate between the display region and an outer edge of the extended outer shape portion to drive the first pixel and the second pixel.

According to an aspect of the present invention, it is possible to reduce a frame width while suppressing an increase in a wiring density.

DETAILED DESCRIPTION OF THE INVENTION

First Embodiment

A first embodiment of the present invention will be described in conjunction with FIGS. 1 to 13. A liquid-crystal display device (a display device) 10 will be described by way of example. An X-axis, a Y-axis, and a Z-axis are shown at a portion in each drawing, and the directions of the axes are depicted so as to correspond to directions shown in each drawing. Also, the upper side in FIGS. 3, 4, 6, 7, 8, 9, 10, 12, and 13 is assumed to be an obverse side, and the lower side in the figures is assumed to be a reverse side.

Figure 1:
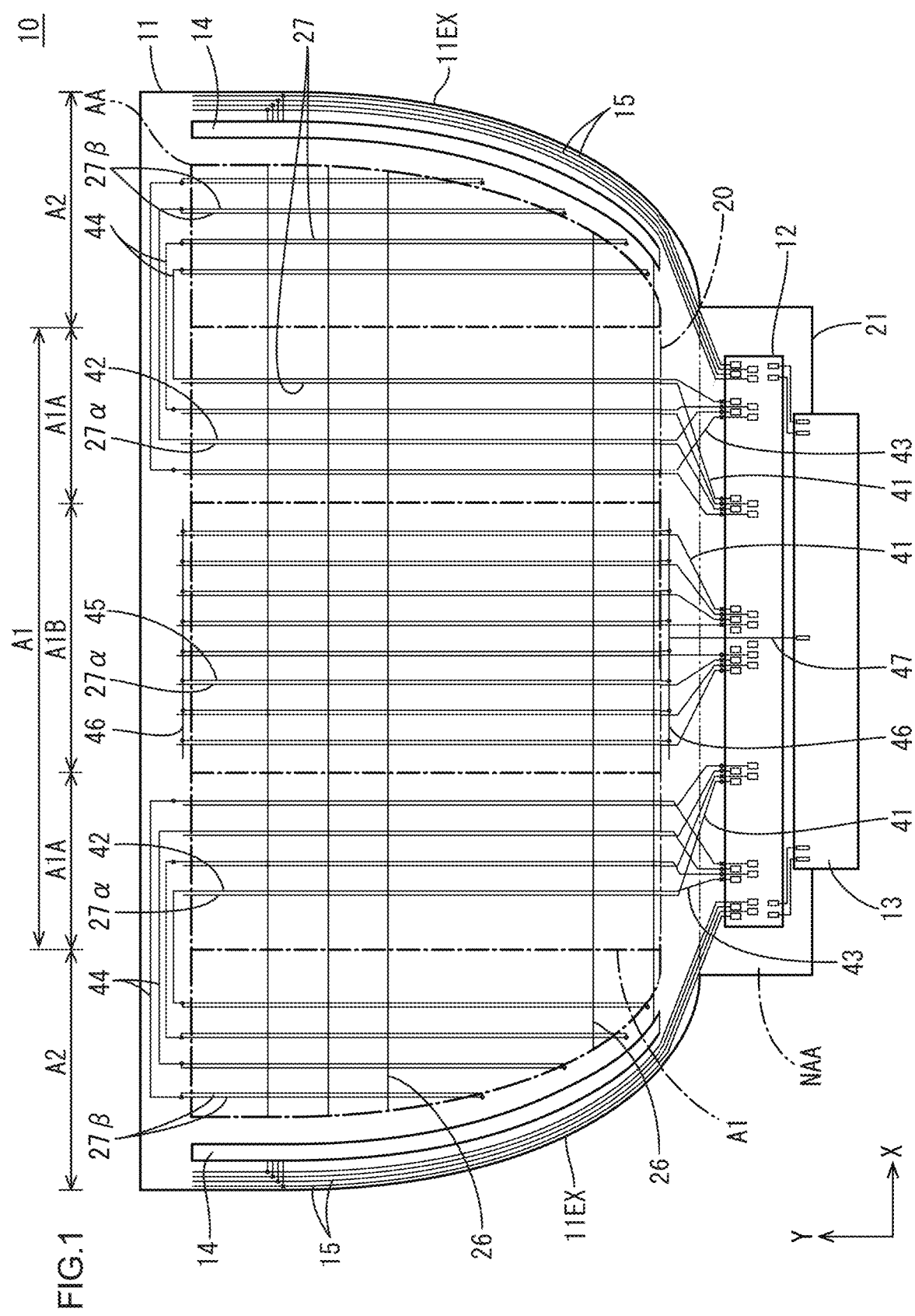
FIG. 1 is a schematic plan view of a liquid-crystal panel comprised by a liquid-crystal display device according to a first embodiment of the present invention.

FIG. 1 is a schematic plan view of the liquid-crystal display device 10. As shown in FIG. 1, the liquid-crystal display device 10 comprises, at least, a liquid-crystal panel (a display panel) 11 that can display an image and a backlight device (a lighting device that is an external light source that illuminates the liquid-crystal panel 11 with light for use in display. The backlight device is arranged at a reverse side (a back side) relative to the liquid-crystal panel 11 and has a light source (for example, LEDs or the like) that emit white-color light (white light), an optical member that applies an optical effect to the light from the light source to thereby convert the light into planar light, and so on.

As shown in FIG. 1, the liquid-crystal panel 11 does not have a typical rectangular shape in its outer shape in plan view and has an odd shape (a non-rectangular shape) including curved line shaped portions (non-straight-line-shaped portions) at portions of its outer shape. The liquid-crystal panel 11 has a horizontally long shape as a whole and has extended outer shape portions 11EX whose width increases as the distance from a driver (a signal supply portion) 12, described below, increases. More specifically, the liquid-crystal panel 11 includes a first region A1 having a horizontally long rectangular shape in plan view and a pair of second regions A2 respectively having the extended outer shape portions 11EX. The first region A1 is positioned at a center side with respect to X-axis direction, whereas the pair of second regions A2 is disposed so as to be positioned at both end sides so as to sandwich the first region A1 with respect to the X-axis direction. The first region A1 protrudes to one side (the lower side shown in FIG. 1) relative to the second regions A2 with respect to Y-axis direction, and the driver 12 and a flexible substrate 13 are mounted at the protrusion portion. The outer shapes of the second regions A2 partly have the extended outer shape portions 11EX having arc shapes (curved line shapes) so as to expand outwardly in plan view. The extended outer shape portions 11EX are configured so that the width thereof decreases as the distance to the driver 12 decreases with respect to the Y-axis direction, conversely increases as the distance from the driver 12 increases, and becomes constant when the distance from the driver 12 becomes larger than or equal to a certain distance. Also, the curvatures of the arc-shaped portions of the extended outer shape portions 11EX change so as to increase as the distance to the driver 12 decreases with respect to the Y-axis direction and so as to conversely decrease as the distance to the driver 12 increases.

As shown in FIG. 1, in the liquid-crystal panel 11, a center-side portion of a screen is a display region (in FIG. 1, a range surrounded by a dashed-and-dotted line) AA in which an image is displayed, whereas a frame-shaped outer-periphery-side portion that surrounds the display region AA of the screen is a non-display region NAA in which no image is displayed. In the liquid-crystal panel 11, the display region AA is disposed so as to lie across the first region A1 and the second regions A2, which are described above, and the shape of the display region AA in plan view is a shape that is similar to the outer shape of the liquid-crystal panel 11 and is thus an odd shape. In the liquid-crystal panel 11, the non-display region NAA is disposed so as to lie across the first region A1 and the second region A2. The non-display region NAA is a region that exists between the display region AA and an outer edge of the liquid-crystal panel 11.

The liquid-crystal panel 11 is made by bonding a pair of substrates 20 and 21 together, as shown in FIG. 1. The obverse side (the front side) of the pair of substrates 20 and 21 is a CF substrate (an opposing substrate) 20, and the reverse side (the back side) of the pair is an array substrate (a substrate, an active matrix substrate) 21. The CF substrate 20 and the array substrate 21 are each made by stacking and forming various films at the inner surface side of a glass substrate. Both the substrates 20 and 21 each include the first region A1 and the second regions A2 described above. A pair of gate circuit portions (pixel driving portions) 14 is provided in the non-display region NAA at the array substrate 21 in a form in which the pair sandwiches the display region AA from both sides with respect to the X-axis direction. The gate circuit portions 14 are monolithically provided utilizing various films provided at the array substrate 21 and are portions for driving pixels PX by supplying scan signals (signals) to gate wires 26, described below. The formation range of the gate circuit portions 14 with respect to the Y-axis direction is equivalent to the display region AA so that they are connected to all the gate wires 26 disposed in the display region AA. The gate circuit portions 14 are disposed in the non-display region NAA between the display region AA and outer edges of the extended outer shape portions 11EX and are positioned in the second regions A2. Each gate circuit portion 14 has an arc shape in plan view in a form in which the outer shape thereof is parallel to the extended outer shape portion 11EX. Gate circuit connection wires 15 that relay and connect the gate circuit portions 14 and the flexible substrate 13 are provided in the non-display region NAA at the array substrate 21. The gate circuit connection wires 15 include clock wires through which clock signals are transmitted, low-potential wires through which low-potential signals are transmitted, start-signal wires through which start signals are transmitted, and so on. Polarizers are respectively bonded to the outer surface sides of both the substrates 20 and 21.

The short-side dimension of the CF substrate 20 is made smaller than the short-side dimension of the array substrate 21, as shown in FIG. 1, and the CF substrate 20 is bonded to the array substrate 21 in a form in which one end portion of the CF substrate 20 with respect to short-side direction (the Y-axis direction) is aligned with the array substrate 21. Accordingly, another end portion of the array substrate 21 with respect to the short-side direction protrudes to the side relative to the CF substrate 20. That is, the first region A1 at the array substrate 21 is extended to one side with respect to the Y-axis direction, compared with the CF substrate 20, and the extended portion is the mounting region of the driver 12 and the flexible substrate 13. The driver 12 is made of an LSI chip having a drive circuit therein, is COG (Chip On Glass)

mounted on the array substrate 21, and processes various signals transmitted via the flexible substrate 13. In the present embodiment, the driver 12 has an elongated block shape that extends along the X-axis direction, and one driver 12 is mounted at an approximately center position on the array substrate 21 with respect to the long-side direction (the X-axis direction). The flexible substrate 13 has a configuration in which a large number of wiring patterns (not shown) are formed on a substrate made of a synthetic resin material (for example, a polyimide-based resin or the like) having an insulation property and flexibility. One end side and another end side of the flexible substrate 13 are respectively connected to the array substrate 21 and a control substrate (a signal supply source), which is not shown. Various signals supplied from the control substrate are transmitted to the liquid-crystal panel 11 via the flexible substrate 13 and are output to the display region AA via processing performed by the driver 12.

Figure 2:
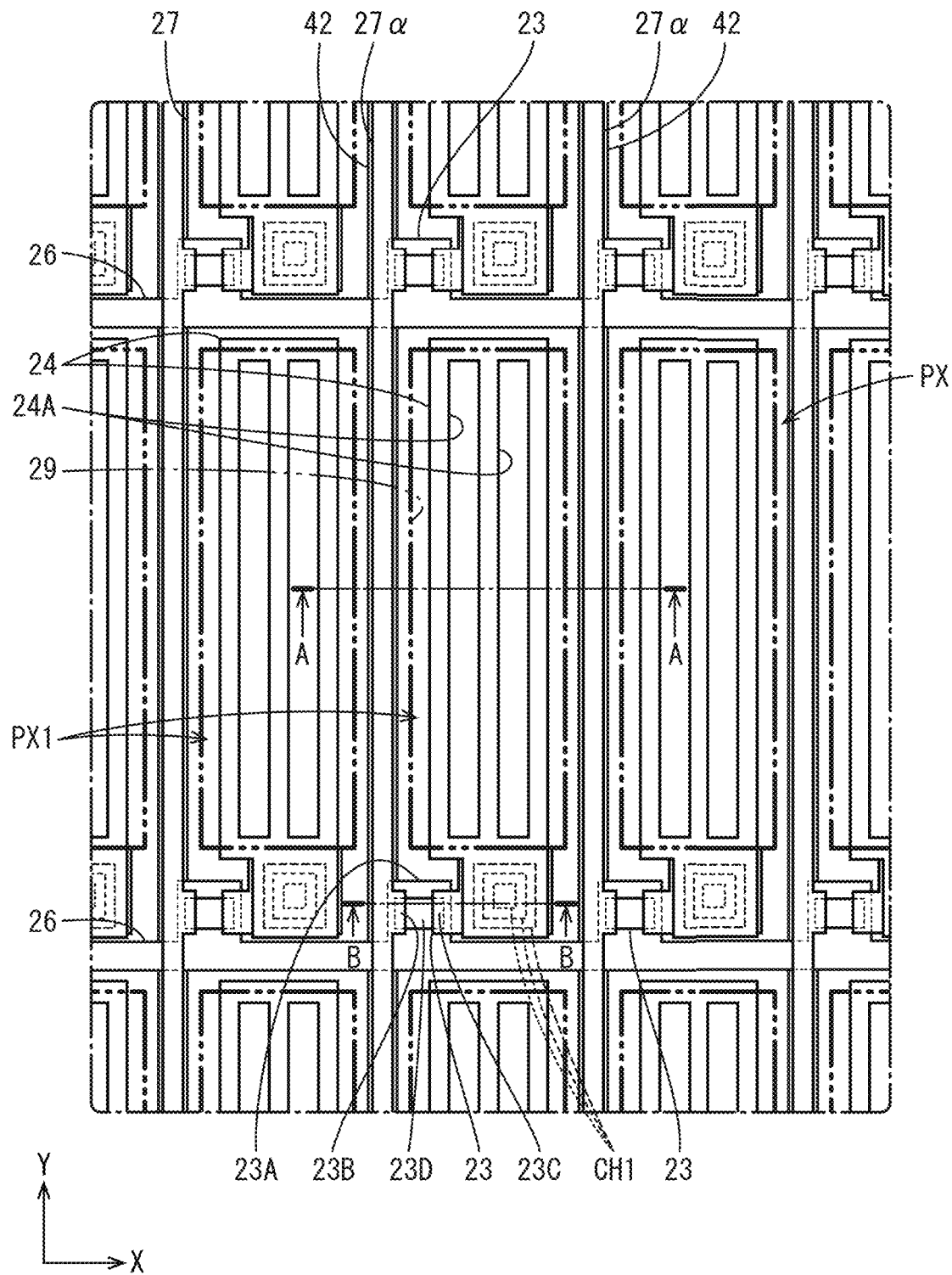
FIG. 2 is a plan view showing a pixel array in a middle region in a first region in the liquid-crystal panel.

FIG. 2 is a plan view of the display region AA at the array substrate 21 and the CF substrate 20 that constitute the liquid-crystal panel 11. As shown in FIG. 2, at least TFTs (thin-film transistors, switching elements) 23 and pixel electrodes 24 are provided at an inner surface side of the array substrate 21 in the display region AA. Two or more TFTs 23 and two or more pixel electrodes 24 are provided side-by-side in a matrix (in a row-and-column arrangement) with gaps therebetween along the X-axis direction and the Y-axis direction. Gate wires (second pixel wires, scan wires) 26 and source wires (pixel wires, image wire, data wires) 27, which form a generally lattice shape, are disposed so as to surround the TFTs 23 and the pixel electrodes 24. The gate wires 26 extend along the X-axis direction, whereas the source wires 27 extend along the Y-axis direction. Each TFT 23 has a gate electrode 23A connected to the gate wire 26, a source electrode 23B connected to the source wire 27, a drain electrode 23C connected to the pixel electrode 24, and a channel portion 23D connected to the source electrode 23B and the drain electrode 23C. Further, the TFT 23 is driven based on a scan signal supplied to the gate wire 26. In response, a potential according to an image signal supplied to the source wire 27 is supplied to the drain electrode 23C via the channel portion 23D, so that the pixel electrode 24 is charged to the potential according to the image signal. The pixel electrode 24 has a vertically long, generally rectangular shape in its plane shape, the short-side direction thereof matches the direction in which the gate wire 26 extends, and the long-side direction matches the direction in which the source wire 27 extends. A plurality (two in FIG. 2) of slits 24A is formed in the pixel electrode 24 along the long-side direction thereof.

Figure 3:
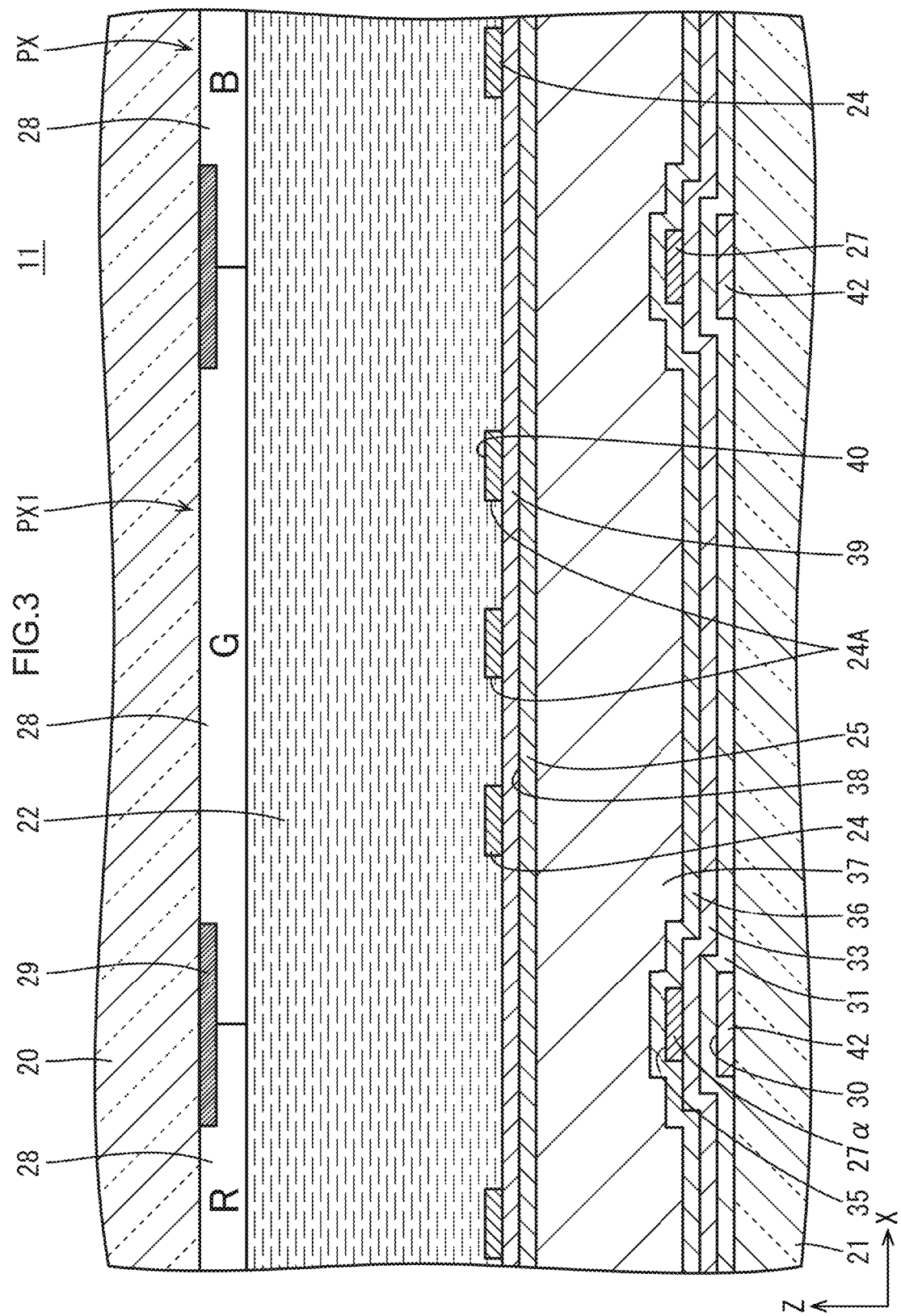
FIG. 3 is a sectional view of the liquid-crystal panel, taken along line A-A in FIG. 2.

FIG. 3 is a sectional view obtained by sectioning the pixels PX in the liquid-crystal panel 11 along the X-axis direction. As shown in FIG. 3, the liquid-crystal panel 11 has a liquid-crystal layer (a medium layer) 22 that is disposed between the pair of substrates 20 and 21 and that contains liquid-crystal molecules, which are substances whose optical characteristics change in response to electrical field application. Seal portions, not shown, that are interposed between both the substrates 20 and 21 surround the liquid-crystal layer 22 to thereby achieve sealing thereof. A common electrode 25 that is positioned at a lower layer side of the pixel electrodes 24 is provided at the inner surface side of the array substrate 21. A reference potential that is always substantially constant is supplied to the common electrode 25, which extends throughout substantially the entire range of the display region AA in a generally solid manner and is disposed so as to overlap all the pixel electrodes 24 in plan view. When the pixel electrodes 24 are charged, a potential difference occurs between the pixel electrodes 24 and the common electrode 25. In response, a fringe electrical field (an oblique electrical field) including components in a normal direction relative to a plate surface of the array substrate 21, in addition to components along the plate surface of the array substrate 21, occurs between opening edges of the slits 24A in the pixel electrodes 24 and the common electrode 25, thus making it possible to control the alignment state of the liquid-crystal molecules contained in the liquid-crystal layer 22 by utilizing the fringe electrical field. That is, the operation mode of the liquid-crystal panel 11 according to the present embodiment is an FFS (Fringe Field Switching) mode. Alignment layers for aligning the liquid-crystal molecules contained in the liquid-crystal layer 22 are respectively formed at innermost surfaces of both the substrates 20 and 21, the innermost surfaces being in contact with the liquid-crystal layer 22.

As shown in FIG. 3, at least, color filters 28 and a light shielding portion (a black matrix) 29 are provided at the inner surface side of the CF substrate 20 in the display region AA. The color filters 28 are provided so as to exhibit three colors: blue (B), green (G), and red (R). Two or more color filters 28 that exhibit colors that differ from each other are repeatedly aligned along the gate wires 26 (the X-axis direction), these color filters 28 also extend along the source wires 27 (the Y-axis direction), and thus the color filters 28 are arrayed in a striped pattern as a whole. These color filters 28 are arranged overlapping the respective pixel electrodes 24 at the array substrate 21 side in plan view. In this liquid-crystal panel 11, the R, G, and B color filters 28 that are aligned along the X-axis direction, the three pixel electrodes 24 that oppose the corresponding color filters 28, and three TFTs 23 connected to the corresponding pixel electrodes 24 constitute three-color pixels PX. Further, in this liquid-crystal panel 11, three-color R, G, and B pixels PX that are neighboring to each other along the X-axis direction constitute display pixels that can perform predetermined-gradation color display.

Figure 4:
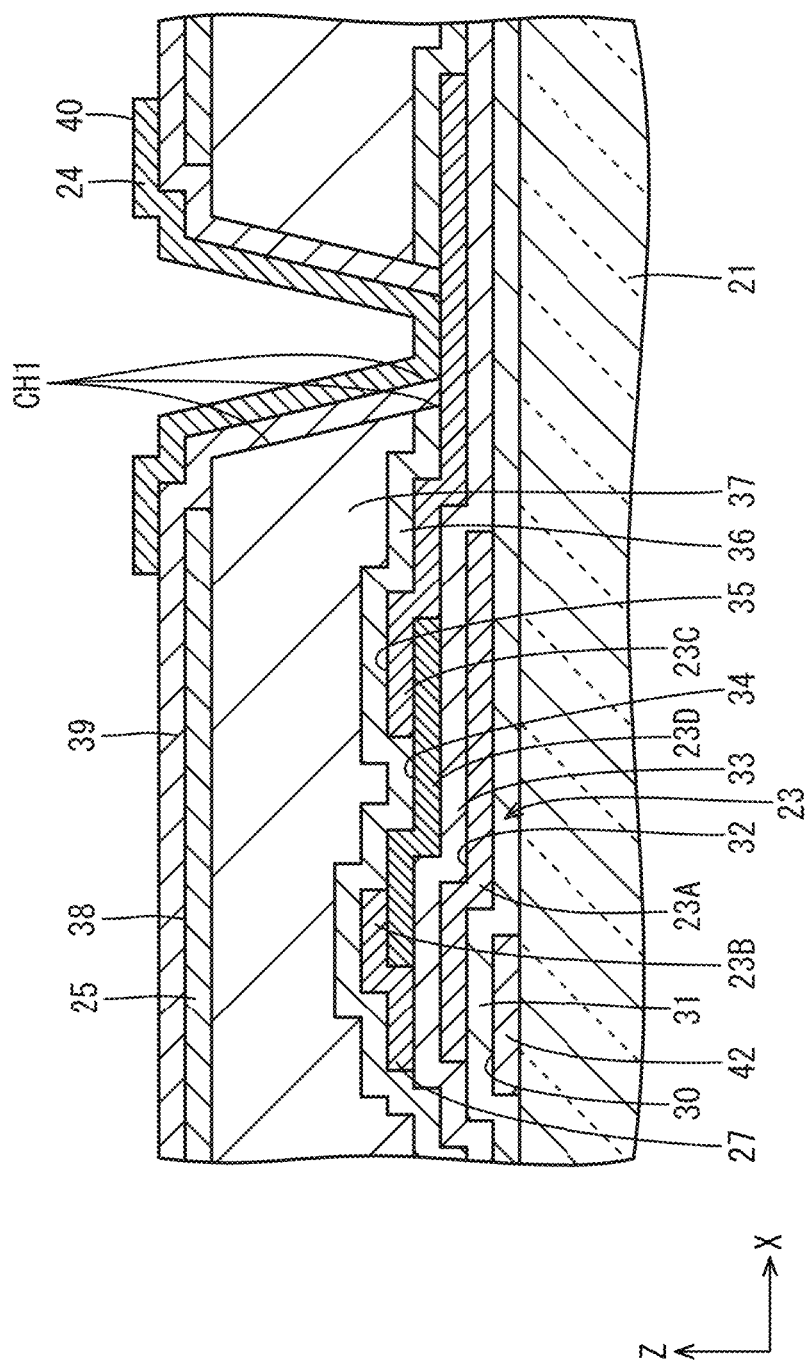
FIG. 4 is a sectional view of an array substrate, taken along line B-B in FIG. 2.

Now, the various films stacked and formed at the inner surface side of the array substrate 21 will be described using FIG. 4. FIG. 4 is a sectional view in the vicinity of the TFT 23 at the array substrate 21. As shown in FIG. 4, a first metal film (a first conductive film) 30, a lower-layer-side insulating film (an insulating film) 31, a second metal film (a second conductive film) 32, a gate insulating film (an insulating film) 33, a semiconductor film 34, a third metal film (a third conductive film) 35, a first interlayer insulating film 36, a planarization film 37, a first transparent electrode film 38, a second interlayer insulating film 39, and a second transparent electrode film 40 are sequentially stacked and formed at the array substrate 21 from the lower layer side (the glass substrate side).

The first metal film 30, the second metal film 32, and the third metal film 35 are each formed of a single layer film made of one type of metallic material selected from copper, titanium, aluminum, molybdenum, tungsten, and so on or a stacked film or alloy made of different types of metallic material to thereby have an electrical conductivity property and a light-shielding property. The first metal film 30 constitutes relay wires 42, dummy wires 45, and so on, which are described below. The second metal film 32 constitutes the gate wires 26, the gate electrodes 23A of the TFTs 23, and so on. The third metal film 35 constitutes the source wires 27, the source electrodes 23B and the drain electrodes 23C of the TFTs 23, and so on. The lower-layer-side insulating film 31, the gate insulating film 33, the first interlayer insulating film 36, and the second interlayer insulating film 39 are each made of inorganic material, such as silicon nitride ($SiN_x$), silicon oxide ($SiO_2$), or the like. The planarization film 37 is made of, for example, organic material, such as PMMA (acrylic resin), and the film thickness thereof is larger than those of other insulating films 31, 33, 36, and 39, which are made of inorganic material. This planarization film 37 planarizes the innermost surface of the array substrate 21. As shown in FIG. 4, the lower-layer-side insulating film 31 maintains the first metal film 30 at the lower layer side and the second metal film 32 at the upper layer side in an insulated state. The gate insulating film 33 maintains the second metal film 32 at the lower layer side and the semiconductor film 34 and the third metal film 35 at the upper layer side in an insulated state. The first interlayer insulating film 36 and the planarization film 37 maintain the semiconductor film 34 and the third metal film 35 at the lower layer side and the first transparent electrode film 38 at the upper layer side in an insulated state. The second interlayer insulating film 39 maintains the first transparent electrode film 38 at the lower layer side and the second transparent electrode film 40 at the upper layer side in an insulated state.

The semiconductor film 34 is made of a thin film using, for example, oxide semiconductor as its material and constitutes the channel portions 23D of the TFTs 23 and so on. The first transparent electrode film 38 and the second transparent electrode film 40 are made of transparent electrode material (for example, ITO (Indium Tin Oxide), IZO (Indium Zinc Oxide), or the like). The first transparent electrode film 38 constitutes the common electrode 25 and so on. The second transparent electrode film 40 constitutes the pixel electrodes 24 and so on. A pixel contact hole CH1 for connecting the pixel electrode 24 to the drain electrode 23C is opened and formed at a position that is located in the first interlayer insulating film 36 and the planarization film 37 and that overlaps both the drain electrode 23C and the pixel electrode 24, as shown in FIG. 4. Only a portion of the pixel electrode 24, the portion being in contact with the drain electrode 23C, is shown in FIG. 4.

Figure 5:
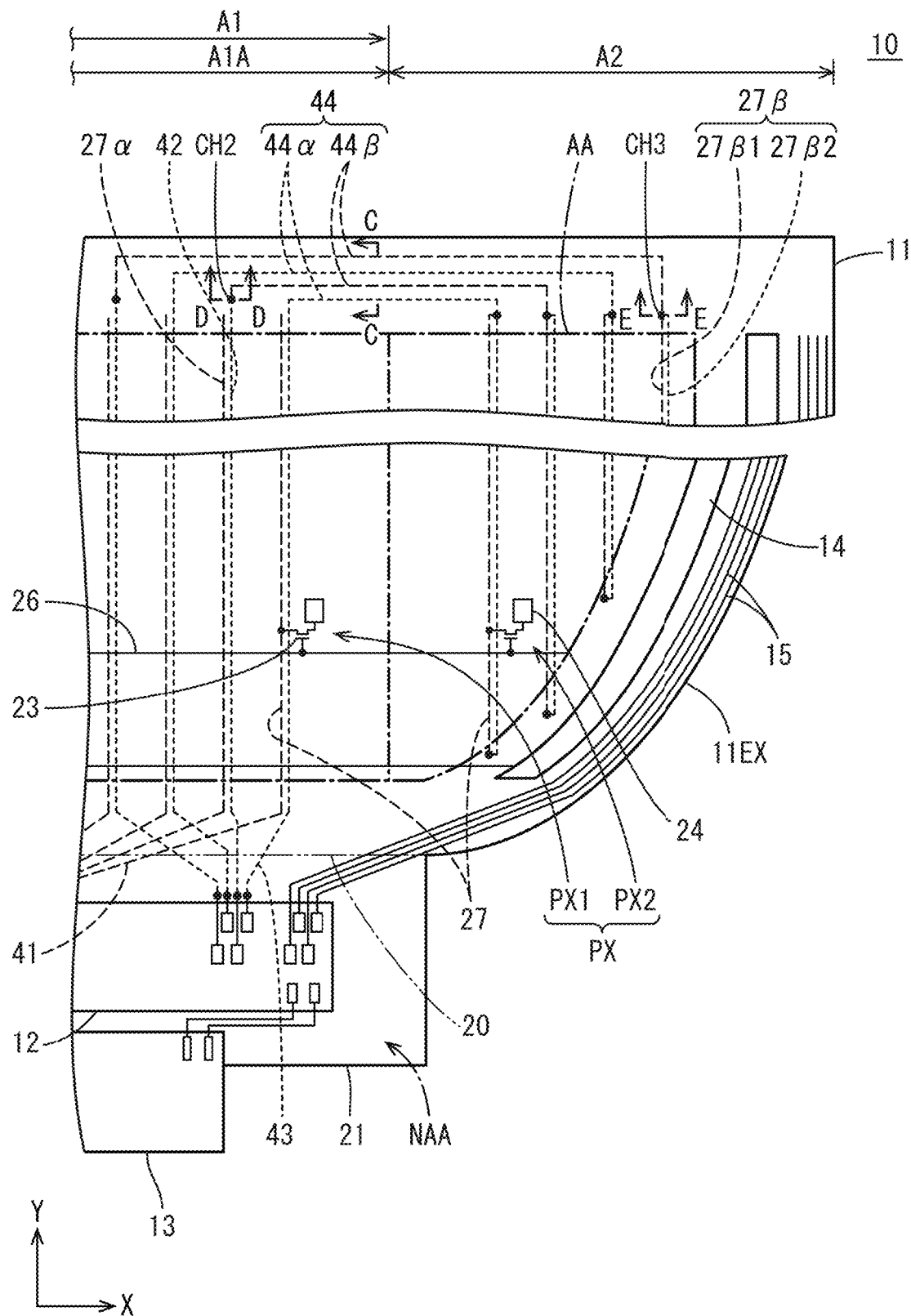
FIG. 5 is a plan view showing routing paths of various wires in the middle region in the first region and in second regions in the liquid-crystal panel.
Figure 7:
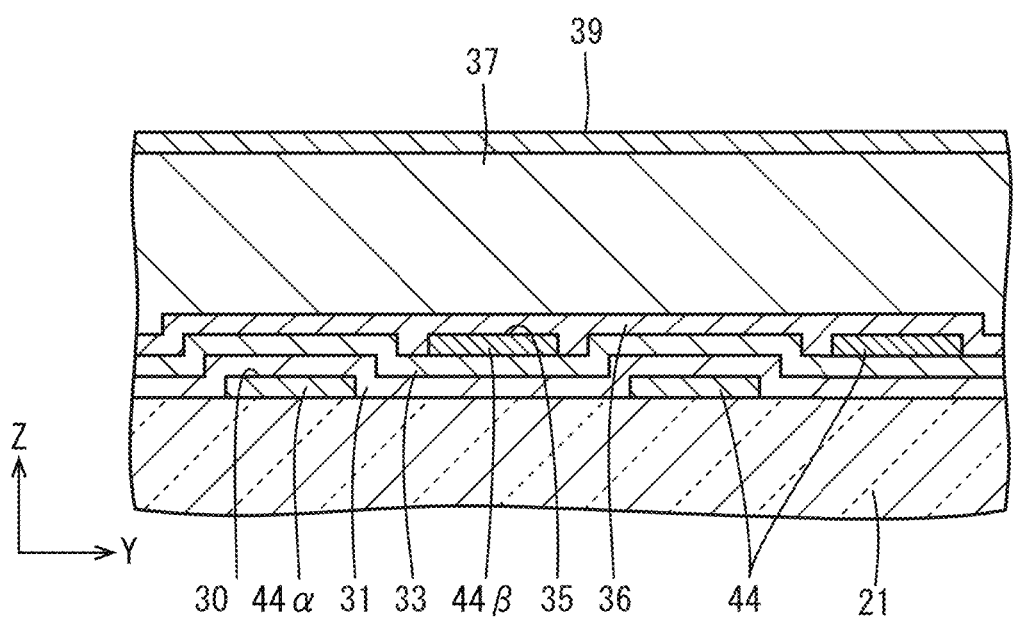
FIG. 7 is a sectional view of the array substrate, taken along line C-C in FIG. 5.

FIG. 5 is a plan view obtained by enlarging the vicinity of the first region A1 and the second region A2 in the liquid-crystal panel 11. Of the source wires 27 according to the present embodiment, the source wires 27 disposed in the first region A1 in the display region AA and the source wires 27 disposed in the second region A2 in the display region AA differ from each other in transmission paths of signals supplied from the driver 12, as shown in FIG. 5. Hereinafter, when the source wires 27 are distinguished therebetween, the source wires 27 that are disposed in the first region A1 in the display region AA are referred to as "first source wires (first pixel wires)" with their reference numeral followed by character "α", and the source wires 27 that are disposed in the second regions A2 in the display region AA are referred to as "second source wires (second pixel wires)" with their reference numeral followed by character "β". When the source wires 27 are collectively referred to without distinction therebetween, the reference numeral thereof is not followed by a character. Also, when the pixels PX are distinguished therebetween, the pixels PX that are disposed in the first region A1 in the display region AA are referred to as "first pixels" with their reference numeral followed by character "1", and the pixels PX that are disposed in the second regions A2 in the display region AA are referred to as "second pixels" with their reference numeral followed by character "2". When the pixels PX are collectively referred to without distinction therebetween, the reference numeral thereof is not followed by a character. In FIG. 5 and FIG. 7, which is described below, with regard to illustration of various wires, line types are varied depending on the types of metal film that constitutes the wires. Specifically, wires constituted by the first metal film 30 are illustrated by dashed lines with short-line segments, wires constituted by the second metal film 32 are illustrated by continuous lines, and wires constituted by the third metal film 35 are illustrated by dashed lines with long-line segments.

End portions of the first source wires 27α disposed in the first region A1 in the display region AA, the end portions being at the driver 12 side with respect to the Y-axis direction, are connected to the driver 12 via lead wires 41, as shown in FIG. 5. The lead wires 41 are disposed in the non-display region NAA between the first region A1 in the display region AA and the driver 12 and are wired in a form in which the lead wires 41 extend in a fan shape from the driver 12 side to the display region AA side. One end portion of each lead wire 41 is connected to a terminal that is provided in the mounting region of the driver 12 on the array substrate 21 and that is connected to a signal output terminal of the driver 12, whereas another end portion of the lead wire 41 is connected to an end portion of the first source wire 27α, the end portion being at the driver 12 side in the Y-axis direction. This first source wire 27α has a single-layer structure that is mainly constituted by the third metal film 35 and is connected in a form in which the first source wire 27α is directly coupled to the source electrodes 23B of the TFTs 23 that constitute the first pixels PX1 in the display region AA (see FIG. 4).

In contrast, the second source wires 27β disposed in the second region A2 in the display region AA are connected to the driver 12 through (via) two or more relay wires 42 and so on disposed in the first region A1 in the display region AA, as shown in FIG. 5. Specifically, in addition to the relay wires 42 described above, a plurality of driver-side lead wires (signal-supply-portion-side lead wires) 43 for providing connection between the relay wires 42 and the driver 12 and a plurality of opposite-side lead wires 44 for providing connection between the second source wires 27β and the relay wires 42 are provided at the array substrate 21. The relay wires 42, the driver-side lead wires 43, and the opposite-side lead wires 44 will be sequentially described in detail.

The relay wires 42 according to the present embodiment do not exist in the entire area of the first region A1 and are selectively disposed in only some ranges. Specifically, the first region A1 can be segmented into a pair of middle regions A1A that are neighboring to the pair of second regions A2 and an opposite-side region A1B that is positioned at an opposite side to the second regions A2 with respect to the middle region A1A so that the opposite-side region A1B and the second regions A2 sandwich the middle regions A1A, as shown in FIG. 1. The opposite-side region A1B is positioned at a center side in the first region A1 with respect to the X-axis direction and is arranged closest to the driver 12. In contrast, the pair of middle regions A1A is positioned at both end sides of the first region A1 with respect to the X-axis direction and is arranged farther from the driver 12 than the opposite-side region A1B and closer to the driver 12 than the second regions A2. When the first region A1 is segmented as described above, the relay wires 42 are selectively disposed in the middle regions A1A in the first region A1, as shown in FIG. 5, and are not disposed in the opposite-side region A1B. That is, the relay wires 42 are not disposed in the opposite-side region A1B, which is far from the second regions A2, and are disposed in the middle regions A1A, which are close to the second regions A2, thus making it possible to reduce the creepage distances of the opposite-side lead wires 44 for connecting the relay wires 42 to the second source wires 27β disposed in the second regions A2. This makes distortion due to a wiring resistance less likely to occur in signals supplied to the second source wires 27β.

Figure 6:
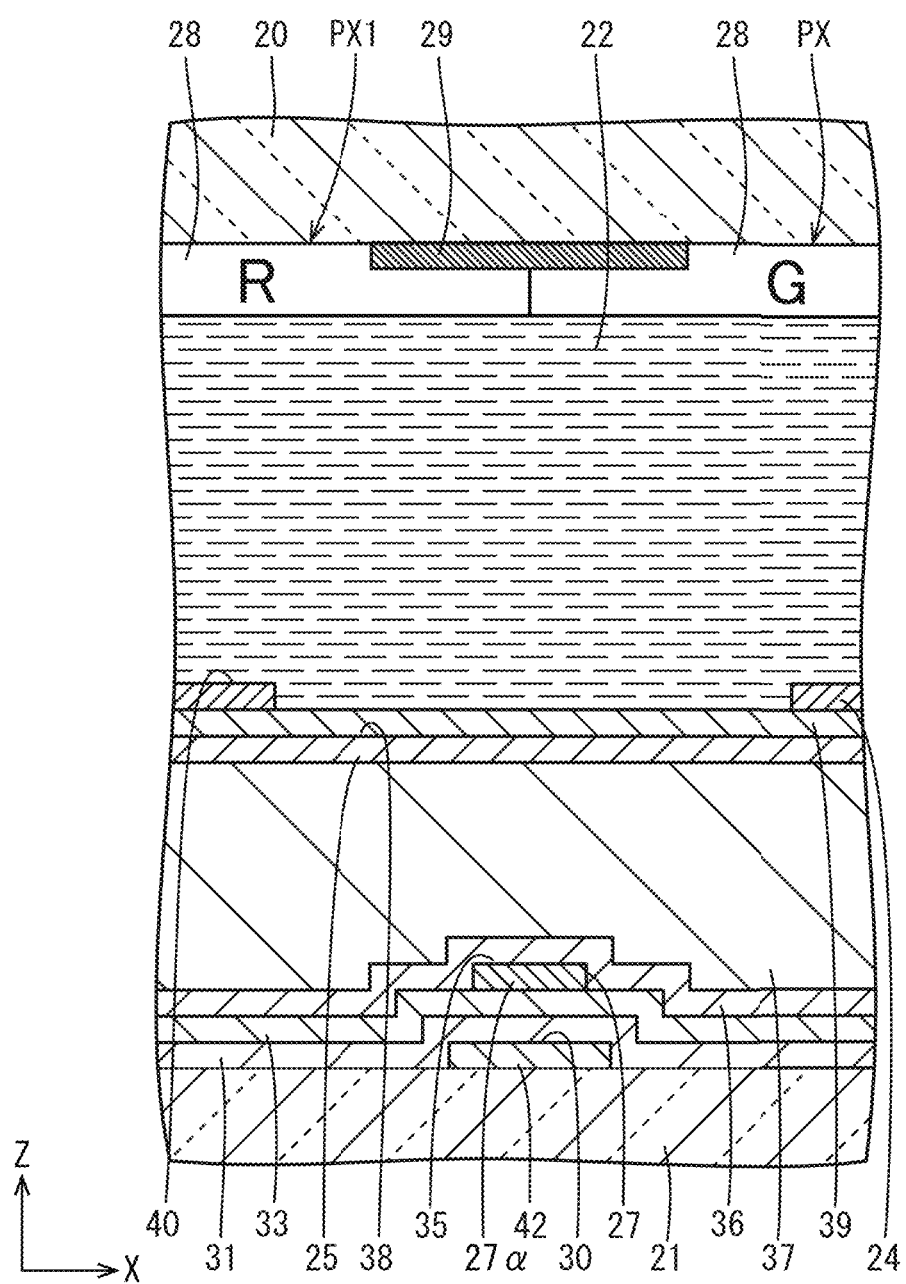
FIG. 6 is a sectional view obtained by sectioning the vicinity of a first source wire and a relay wire in the middle region in the first region in the liquid-crystal panel.

FIG. 6 is a sectional view obtained by sectioning the vicinity of the first source wire 27α and the relay wire 42 in the middle region A1A in the first region A1 in the liquid-crystal panel 11. As shown in FIG. 6, the relay wire 42 is constituted by the first metal film 30 and is disposed in a layer that is different from the layer of the first source wire 27α constituted by the third metal film 35. Further, the relay wire 42 is disposed so as to overlap the first source wire 27α via the lower-layer-side insulating film 31 and the gate insulating film 33. This makes it possible to reduce the arrangement space of the relay wires 42 and the first source wires 27α, so that the aperture ratio of the first pixels PX1 disposed in the first region A1 in the display region AA can be kept high. Since the relay wires 42 are constituted by the first metal film 30, as described above, the relay wires 42 are not connected to the TFTs 23 that are disposed in the middle regions A1A and that constitute the first pixels PX1. As shown in FIG. 5, each relay wire 42 transverses the display region AA along the Y-axis direction in a form in which the relay wire 42 is parallel to the first source wire 27α, and both end portions of the relay wire 42 are disposed outside the display region AA, that is, in the non-display region NAA, and are connected to the driver-side lead wire 43 and the opposite-side lead wire 44. The structure of connection of the driver-side lead wires 43 and the opposite-side lead wires 44 to the relay wires 42 is described below later.

As shown in FIG. 5, the driver-side lead wires 43 are provided in a form in which they extend in the middle regions A1A between the display region AA and the driver 12 at the array substrate 21. One end portion of each driver-side lead wire 43 is connected to a terminal that is provided in the mounting region of the driver 12 on the array substrate 21 and that is connected to a signal output terminal of the driver 12, whereas another end portion of the driver-side lead wire 43 is connected to an end portion of the relay wire 42, the end portion being at the driver 12 side with respect to the Y-axis direction. This driver-side lead wire 43 has a single-layer structure that is mainly constituted by the first metal film 30. That is, since the driver-side lead wire 43 is disposed in the same layer as the layer of the relay wire 42, the driver-side lead wire 43 is directly coupled to the above-described end portion of the relay wire 42 without passing through a contact hole or the like.

The opposite-side lead wires 44 are disposed so as to be positioned at an opposite side to the driver 12 side with respect to the display region AA at the array substrate 21 with respect to the Y-axis direction and between the display region AA and an outer edge of the array substrate 21 and extend in a form in which the opposite-side lead wires 44 lie across the middle regions A1A and the second regions A2 with respect to the X-axis direction, as shown in FIG. 5. One end portion (at the middle region A1A side) of each opposite-side lead wire 44 is connected to the end portion of the relay wire 42, the end portion being at the opposite side to the driver 12 side, whereas another end portion (at the second region A2 side) of the opposite-side lead wire 44 is connected to an end portion of the second source wire 27β, the end portion being at the opposite side to the driver 12 side. Accordingly, image signals output from the driver 12 are supplied to the relay wires 42 disposed in the middle regions A1A in the first region A1 through the driver-side lead wires 43, and are then supplied to the second source wires 27β through the opposite-side lead wires 44. An end portion of each second source wire 27β, the end portion being at the driver 12 side, is not connected to the driver 12, and the end portion of the second source wire 27β, the end portion being at the opposite side to the driver 12 side, is connected to the opposite-side lead wire 44, so that the second source wire 27β receive a signal supplied from the driver 12. Further, since the driver-side lead wires 43 are connected to the relay wires 42 disposed in the middle regions A1A in the first region A1 in the display region AA and to the driver 12 and are avoided being disposed between the display region AA and the outer edges of the extended outer shape portions 11EX, it is possible to reduce the width of a frame while suppressing an increase in the wiring density between the display region AA and the outer edges of the extended outer shape portions 11EX. In particular, since the wiring density tends to become high since the gate circuit portions 14 and the gate circuit connection wires 15 for driving the first pixels PX1 and the second pixels PX2 are disposed between the display region AA and the outer edges of the extended outer shape portions 11EX, this is preferable in that it is possible to reduce the width of the frame while suppressing a further increase in the wiring density.

FIG. 7 is a sectional view obtained by sectioning the vicinity of the opposite-side lead wires 44 at the array substrate 21. As shown in FIG. 7, the opposite-side lead wires 44 include first opposite-side lead wires 44α, which are constituted by the first metal film 30, and second opposite-side lead wires 44β, which are constituted by the third metal film 35. According to such a configuration, it is possible to reduce the space of the opposite-side lead wires 44. Thus, the frame width between the display region AA and the outer edge of the array substrate 21 at the opposite side to the driver 12 can be kept small.

Hereinafter, when the opposite-side lead wires 44 are distinguished therebetween, the opposite-side lead wires 44 that are constituted by the first metal film 30 are referred to as "first opposite-side lead wires" with their reference numerals followed by character "α", and the opposite-side lead wires 44 that are constituted by the third metal film 35 are referred to as "second opposite-side lead wires" followed by character "β". When the opposite-side lead wires 44 are collectively referred to without distinction therebetween, the reference numeral thereof is not followed by a character. Since the first opposite-side lead wires 44α are constituted by the first metal film 30 that is the same as that of the relay wires 42, the first opposite-side lead wires 44α are directly coupled to the relay wires 42 without passing through contact holes or the like. This simplifies the connection structure.

Figure 8:
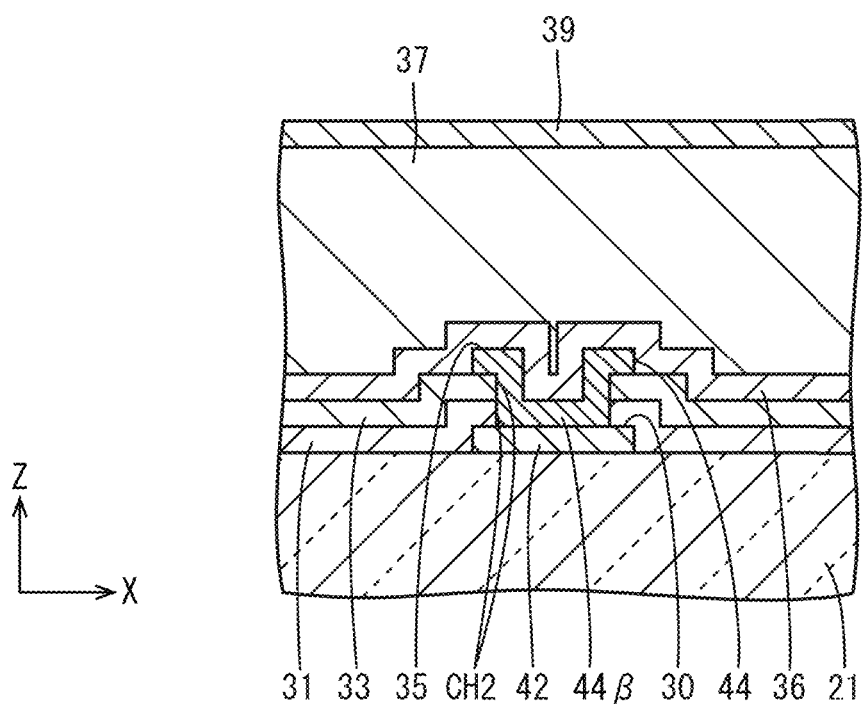
FIG. 8 is a sectional view of the array substrate, taken along line D-D in FIG. 5.

FIG. 8 is a sectional view obtained by sectioning the vicinity of a connection portion of the second opposite-side lead wire 44β and the relay wire 42 at the array substrate 21. The second opposite-side lead wire 44β is constituted by the third metal film 35 that is the same as that of the first source wire 27α, as shown in FIGS. 5 and 8. Accordingly, the lower-layer-side insulating film 31 and the gate insulating film 33 are interposed between the second opposite-side lead wire 44β, which is constituted by the third metal film 35, and the relay wire 42, which is constituted by the first metal film 30. An inter-wire contact hole CH2 for providing connection between an end portion of the relay wire 42, the end portion being at the opposite side to the driver 12 side, and one end portion of the second opposite-side lead wire 44β is opened and formed at a position that is located in the lower-layer-side insulating film 31 and the gate insulating film 33 and that overlaps both the end portions. The relay wire 42 and the second opposite-side lead wire 44β are connected through the inter-wire contact hole CH2.

Figure 9:
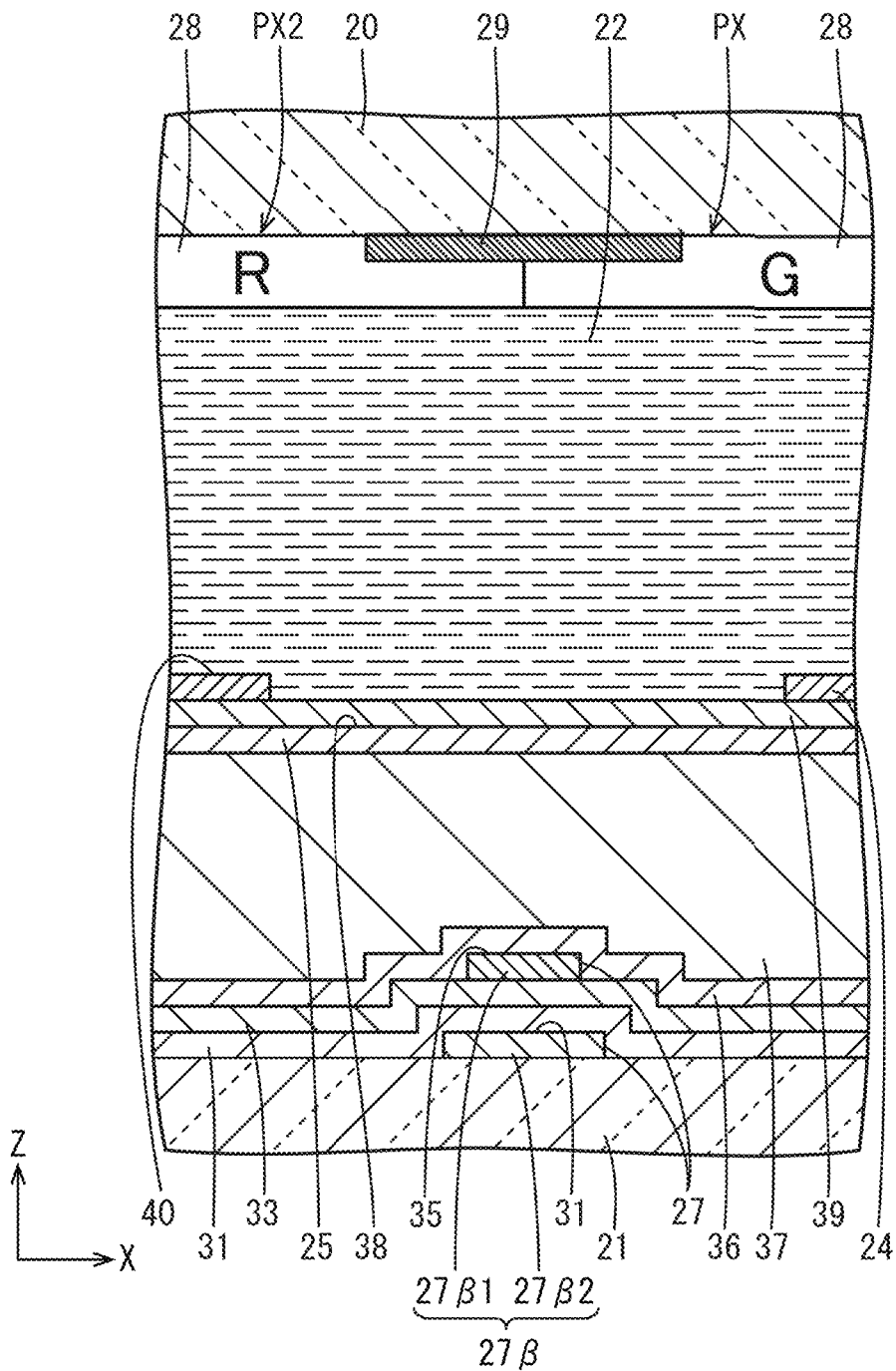
FIG. 9 is a sectional view obtained by sectioning the vicinity of a second source wire in the second region in the liquid-crystal panel.

Subsequently, the configuration of the second source wire 27β will be described in detail with reference to FIG. 9. FIG. 9 is a sectional view obtained by sectioning the second source wire 27β in the second region A2 in the liquid-crystal panel 11. As shown in FIG. 9, the second source wire 27β is constituted by a main source wire part (a main pixel wire part) 27β1 connected to the TFT 23 that constitutes the second pixel PX2 and a sub source wire part (a sub pixel wire part) 27β2 disposed in a layer different from that of the main source wire part 27β1 and connected to the main source wire part 27β1. Since the second source wire 27β has a stacked structure of the main source wire part 27β1 and the sub source wire part 27β2 that are connected to each other, it is possible to reduce the wiring resistance in the second source wire 27β. Thus, distortion is less likely to occur in an image signal that is supplied from the driver 12 to the second pixel PX2 through the driver-side lead wire 43, the relay wire 42, the opposite-side lead wire 44, and the second source wire 27β. More specifically, the main source wire part 27β1 is constituted by the third metal film 35 that is the same as that of the first source wire 27α and is connected in a form in which the main source wire part 27β1 is directly coupled to the source electrode 23B of the TFT 23 that constitutes the second pixel PX2 in the display region AA (see FIG. 4). Accordingly, the connection structure of the second pixel PX2 and the second source wire 27β and the connection structure of the first pixel PX1 and the first source wire 27α can be shared. In contrast, the sub source wire part 27β2 is constituted by the first metal film 30 that is the same as that of the relay wire 42 and is disposed in a layer that is different from that of the main source wire part 27β1. Further, the main source wire part 27β1 is disposed so as to overlap the sub source wire part 27β2 via the lower-layer-side insulating film 31 and the gate insulating film 33. This makes it possible to reduce the arrangement space of the main source wire parts 27β1 and the sub source wire parts 27β2, so that the aperture ratio of the second pixels PX2 disposed in the second regions A2 in the display region AA can be kept high.

As described above, since each main source wire part 27β1 is constituted by the third metal film 35, as shown in FIG. 5, an end portion of the main source wire part 27β1, the end portion being at the opposite side to the driver 12 side with respect to the Y-axis direction, is directly coupled to another end portion of the second opposite-side lead wire 44β, which is constituted by the same third metal film 35. Similarly, since each sub source wire part 27β2 is constituted by the first metal film 30, an end portion of the sub source wire part 27β2, the end portion being at the opposite side to the driver 12 side with respect to the Y-axis direction, is directly coupled to another end portion of the first opposite-side lead wire 44α, which is constituted by the same first metal film 30. As described above, the second source wire 27β is connected to the opposite-side lead wire 44 without passing through a contact hole or the like and has a simplified connection structure.

Figure 10:
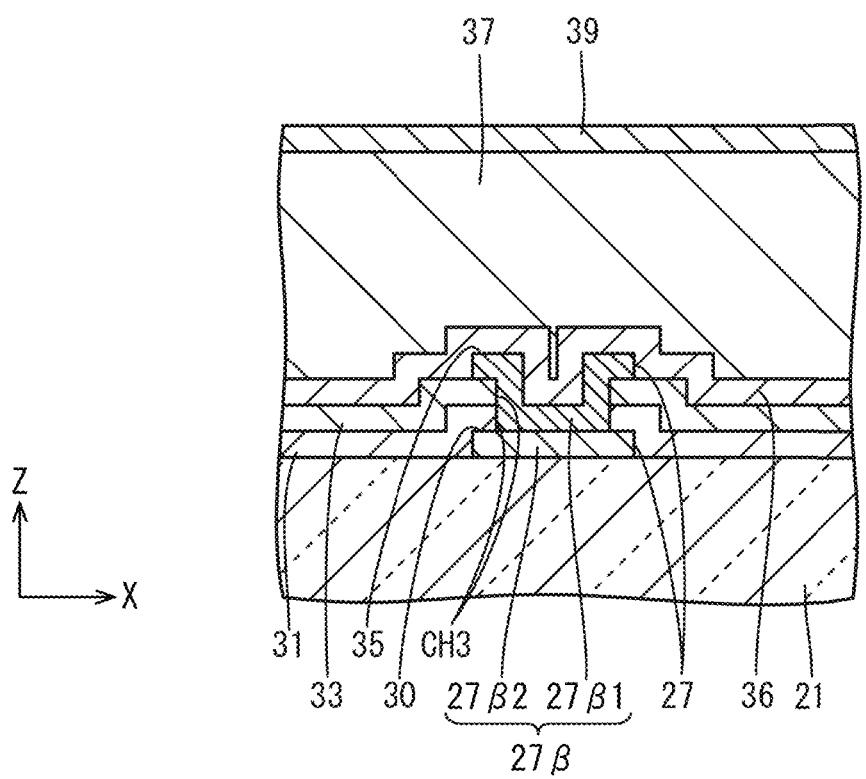
FIG. 10 is a sectional view of the array substrate, taken along line E-E in FIG. 5.

The connection structure of the main source wire part 27β1 and the sub source wire part 27β2 will be described with reference to FIGS. 5 and 10. FIG. 10 is a sectional view obtained by sectioning a connection portion of the main source wire part 27β1 and the sub source wire part 27β2 in the second region A2 at the array substrate 21. As shown in FIG. 5, both end portions of each of the main source wire part 27β1 and the sub source wire part 27β2 with respect to the Y-axis direction are disposed outside the display region AA, that is, in the non-display region NAA. Further, as shown in FIG. 10, inter-wiring-line-portion contact holes (contact holes) CH3 are respectively opened and formed at positions that are located in the lower-layer-side insulating film 31 and the gate insulating film 33 interposed between the main source wire part 27β1 and the sub source wire part 27β2 and that overlap both end portions of each of the main source wire part 27β1 and the sub source wire part 27β2 with respect to the Y-axis direction. one end portion of the main source wire part 27β1 and one end portion of the sub source wire part 27β2 with respect to the Y-axis direction are connected to each other outside the display region AA through the inter-wiring-line-portion contact holes CH3 and another end portion of the main source wire part 27β1 and another end portion of the sub source wire part 27β2 with respect to the Y-axis direction are connected to each other outside the display region AA through the inter-wiring-line-portion contact holes CH3. This makes it possible to avoid a reduction in the aperture ratio of the second pixels PX2, the reduction being caused by the inter-wiring-line-portion contact holes CH3 for providing connection between the main source wire parts 27β1 and the sub source wire parts 27β2.

Figure 11:
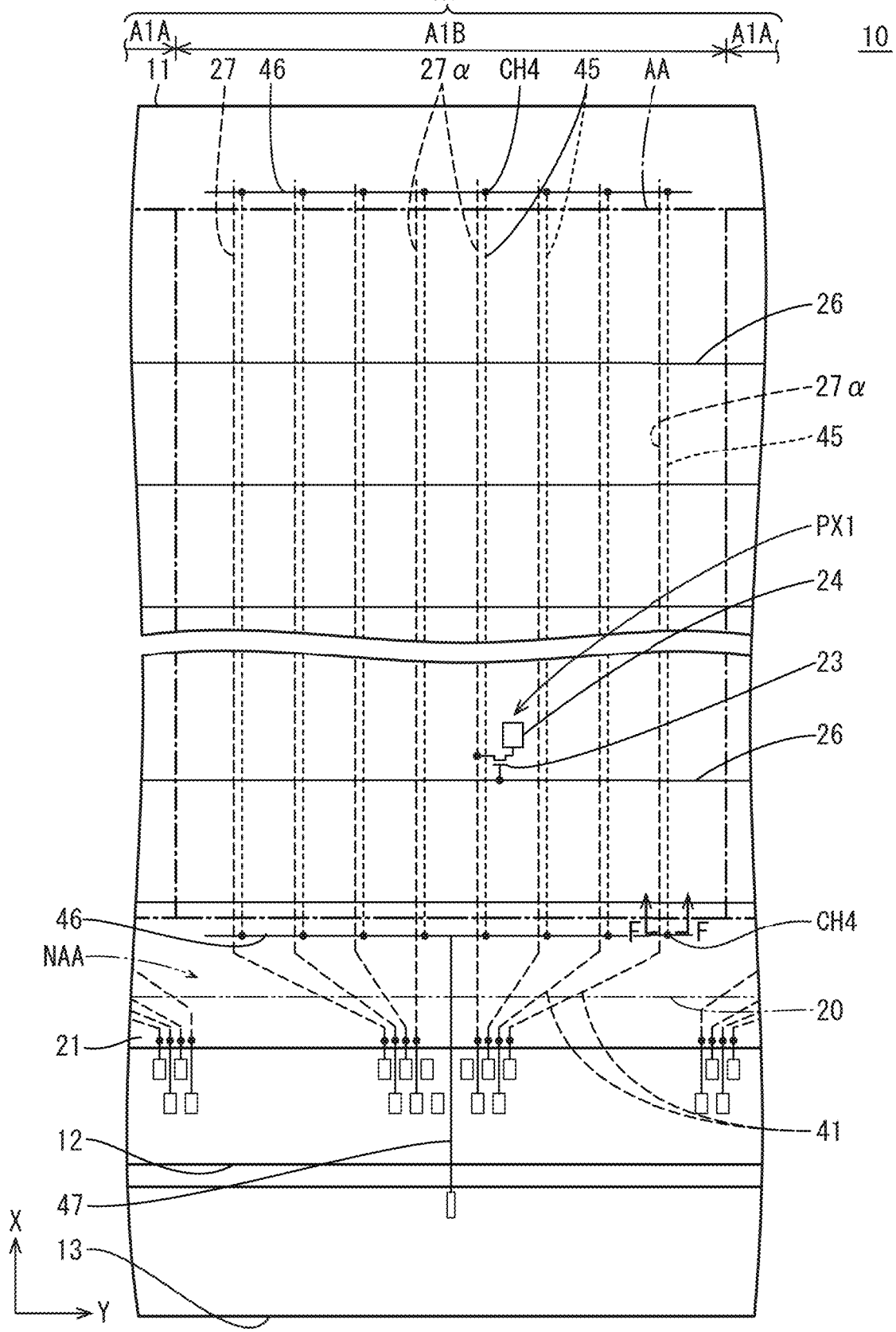
FIG. 11 is a plan view showing routing paths of various wires in an opposite-side region in the first region in the liquid-crystal panel.
Figure 12:
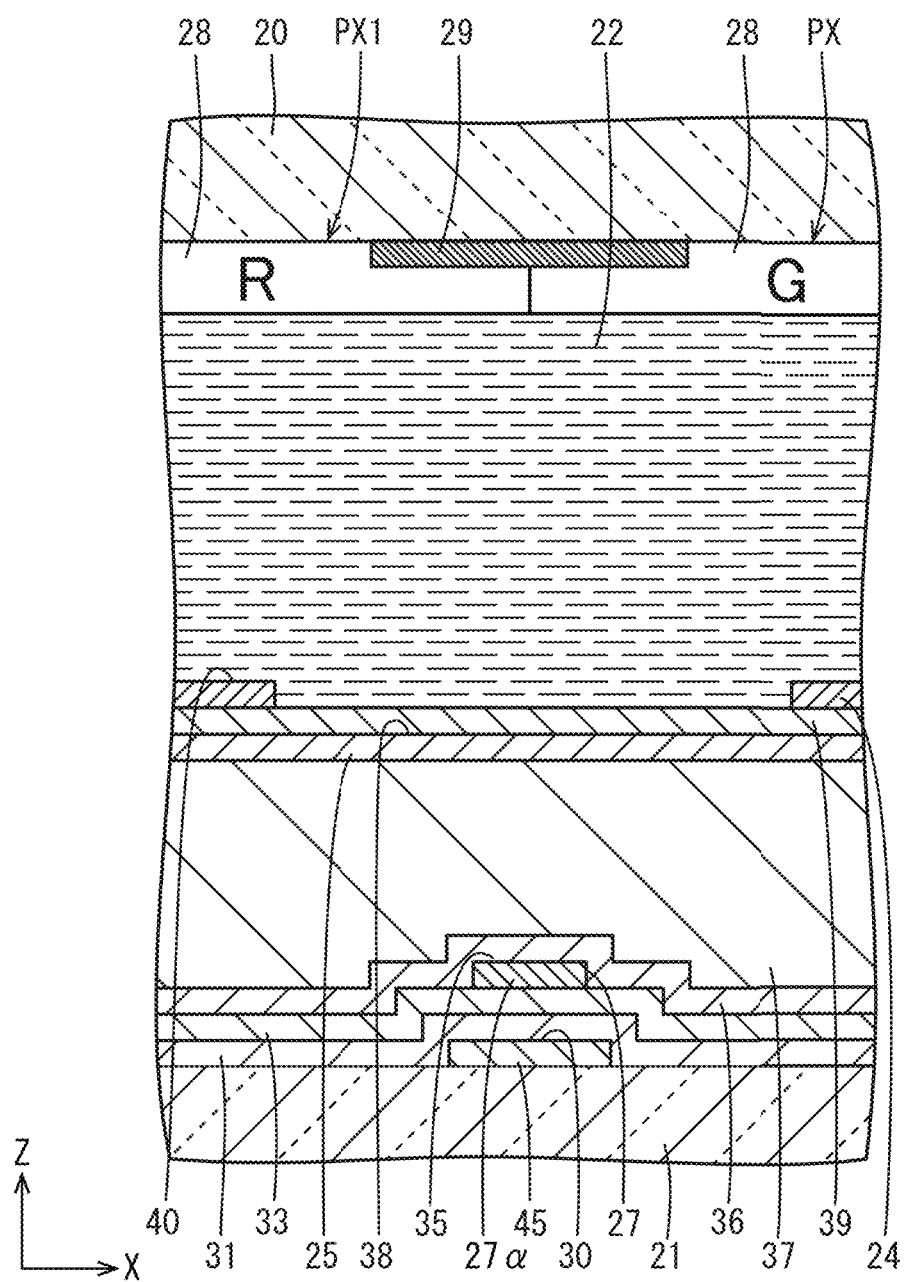
FIG. 12 is a sectional view obtained by sectioning the vicinity of the first source wire and a dummy wire in the opposite-side region in the first region in the liquid-crystal panel.
Figure 13:
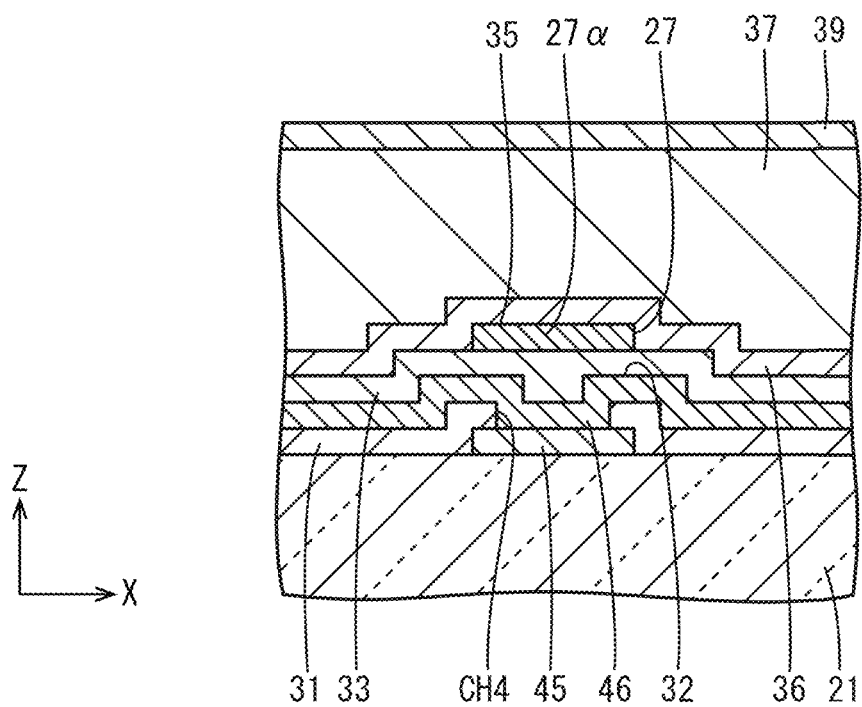
FIG. 13 is a sectional view of the array substrate, taken along line F-F in FIG. 11.

Next, a configuration in the opposite-side region A1B in the first region A1 will be described with reference to FIGS. 11 to 13. FIG. 11 is a plan view obtained by enlarging the vicinity of the opposite-side region A1B in the first region A1 at the array substrate 21. FIG. 12 is a sectional view obtained by sectioning the vicinity of the first source wire 27α and the dummy wire 45 in the opposite-side region A1B in the first region A1 in the liquid-crystal panel 11. The dummy wires 45 that are disposed so as to overlap the first source wires 27α via the lower-layer-side insulating film 31 and the gate insulating film 33 are selectively provided in the opposite-side region A1B in the first region A1 in the display region AA, as shown in FIGS. 11 and 12, and no relay wires 42 are provided in the opposite-side region A1B. Each dummy wire 45 is not electrically connected to the overlapping first source wire 27α. The dummy wire 45 is constituted by the first metal film 30 that is the same as that of the sub source wire part 27β2 of the second source wire 27β and the relay wire 42. The positional relationship between the first source wire 27α and the dummy wire 45 disposed in the opposite-side region A1B in the first region A1 is equivalent to the positional relationship (see FIG. 6) between the first source wire 27α and the relay wire 42 disposed in the middle region A1A in the first region A1. Accordingly, even when a parasitic capacitance occurs between the first source wire 27α and the relay wire 42 in the middle region A1A, the parasitic capacitance becomes equivalent to a parasitic capacitance that occurs between the first source wire 27α and the dummy wire 45 in the opposite-side region A1B, thus reducing the difference that can occur therebetween. Thus, a difference between distortion that can occur in image signals transmitted to the first source wires 27α in the middle regions A1A and distortion that can occur in image signals transmitted to the first source wires 27α in the opposite-side region A1B becomes less likely to occur, and a display failure becomes less likely to be viewed.

As shown in FIG. 11, the number of dummy wires 45 that are disposed in the opposite-side region A1B is the same as the number of first source wires 27α, and both end portions of each dummy wire 45 with respect to the Y-axis direction are disposed outside the display region AA, that is, in the non-display region NAA. Short-circuit wires 46 disposed between the display region AA and the outer edge of the array substrate 21 are connected to all the dummy wires 45. A pair of short-circuit wires 46 is provided in the opposite-side region A1B at the array substrate 21 in a form in which the pair sandwiches the display region AA from both sides with respect to the Y-axis direction. Of the pair of short-circuit wires 46, one short-circuit wire (a signal-supply-portion-side short-circuit wire) 46 is disposed in a form in which it is interposed between the display region AA and the driver 12 with respect to the Y-axis direction, and the other short-circuit wire (an opposite-side short-circuit wire at the opposite side to the signal supply portion side) 46 is disposed at a position between the display region AA and the outer edge of the array substrate 21, the outer edge being at the opposite side to the driver 12 side with respect to the Y-axis direction. One of the short-circuit wires 46 is routed so as to extend linearly along the X-axis direction and transverses end portions of the respective dummy wires 45, the end portions being at the driver 12 side with respect to the Y-axis direction. A signal input wire 47 to which a reference potential signal with a constant potential is supplied is connected to one of the short-circuit wires 46. One end portion of the signal input wire 47 is connected to one of the short-circuit wires 46, whereas another end portion of the signal input wire 47 is connected to a terminal that is provided in the mounting region of the flexible substrate 13 and that is connected to the signal output terminal of the flexible substrate 13. The signal input wire 47 extends along the Y-axis direction and is routed in a form in which it transverses the mounting region of the driver 12 on the array substrate 21. The reference potential signal transmitted through the signal input wire 47 is also used for a reference potential signal supplied to the common electrode 25. Since the reference potential signal with a constant potential is supplied to the short-circuit wires 46 through the signal input wire 47, as described above, parasitic capacitances that occur between the first source wires 27α and the dummy wires 45 disposed in the opposite-side region A1B in the display region AA become stable. The other short-circuit wire 46 is routed so as to extend linearly along the X-axis direction and transverses the end portions of the dummy wires 45, the end portions being at the opposite side to the driver 12 side with respect to the Y-axis direction.

The connection structure of the dummy wire 45 and the short-circuit wire 46 will be described using FIG. 13. FIG. 13 is a sectional view obtained by sectioning the vicinity of the dummy wire 45 and the short-circuit wire 46 in the middle region A1A in the first region A1 at the array substrate 21. As shown in FIG. 13, the short-circuit wire 46 is constituted by the second metal film 32 that is the same as that of the gate wire 26 and so on and is disposed at the upper layer side of the dummy wire 45 via the lower-layer-side insulating film 31, the short-circuit wire 46 being connected to the dummy wire 45. A short-circuit contact hole CH4 is opened and formed at a position that is located in the lower-layer-side insulating film 31 and that overlaps both the short-circuit wire 46 and the dummy wire 45. The short-circuit wire 46 and the dummy wire 45 are connected to each other through the short-circuit contact hole CH4. The dummy wires 45 are short-circuited by the short-circuit wires 46 connected through the short-circuit contact holes CH4, as described above, and a reference potential signal with a constant potential is supplied to all the dummy wires 45. This makes the potentials in the dummy wires 45 stable, so that parasitic capacitances that occur between the first source wires 27α and the dummy wires 45 become more stable. As shown in FIG. 11, the signal input wire 47 is constituted by the same second metal film 32 as the short-circuit wires 46, and is directly coupled to one of the short-circuit wires 46 without passing through a contact hole or the like.

As described above the liquid-crystal display device (a display device) 10 in the present embodiment comprises: a driver (a signal supply portion) 12 that supplies a signal; an array substrate (a substrate) 21 having an extended outer shape portion 11EX whose width increases as a distance from the driver 12 increases, the array substrate 21 including a first region A1 and a second region A2 that is disposed as to be neighboring to the first region A1 and that has the extended outer shape portion 11EX; a display region AA that is disposed in the array substrate 21 so as to lie across the first region A1 and the second region A2 and that displays an image; a first pixel PX1 disposed in the first region A1 in the display region AA; a second pixel PX2 disposed in the second region A2 in the display region AA; a first source wire (a first pixel wire) 27α disposed in the first region A1 in the display region AA and connected to the first pixel PX1 and the driver 12; a second source wire (a second pixel wire) 27β disposed in the second region A2 in the display region AA and connected to the second pixel PX2; a relay wire 42 disposed in the first region A1 in the display region AA; a driver-side lead wire (a signal-supply-portion-side lead wire) 43 connected to the driver 12 and an end portion of the relay wire 42, the end portion being at the driver 12 side; and an opposite-side lead wire 44 connected to end portions of the relay wire 42 and the second source wire 27β, the end portions being at an opposite side to the driver 12 side.

With this arrangement, the first pixels PX1 and the second pixels PX2 are charged based on signals supplied from the driver 12, so that an image is displayed in the display region AA. In this case, the second regions A2 disposed at the array substrate 21 so as to be neighboring to the first region A1 have the extended outer shape portions 11EX, and thus, if a configuration in which the lead wires are connected to the end portions of second source wires 27β, the end portions being at the driver 12 side, and to the driver 12 is employed, the lead wires are routed in regions between the display region AA and the outer edges of the extended outer shape portions 11EX so as to lie along the outer edges of the extended outer shape portions 11EX. For the reason that, for example, the lead wires are complex in the routing paths, compared with the lead wires connected to the first source wires 27α, and thus, the frame width between the display region AA and the outer edges of the extended outer shape portions 11EX is reduced, and when the wiring density increases, failures, such as short-circuiting, tend to be more likely to occur.

In contrast, the second source wires 27β disposed in the second regions A2 in the display region AA have a configuration in which the end portions of the second source wires 27β, the end portions being at the opposite side to the driver 12 side, are connected to the end portions of the relay wires 42 disposed in the first region A1 in the display region AA via the opposite-side lead wires 44, the end portions being at the opposite side to the driver 12 side. The end portions of the relay wires 42 disposed in the first region A1 in the display region AA, the end portions being at the driver 12 side, are connected to the driver-side lead wires 43, and the relay wires 42 are adapted so that signals from the driver 12 are supplied thereto through the driver-side lead wires 43. Accordingly, signals are supplied to the second source wires 27β through the driver-side lead wires 43, the relay wires 42 disposed in the first region A1 in the display region AA, and the opposite-side lead wires 44. Since the driver-side lead wires 43 are connected to the relay wires 42 disposed in the first region A1 in the display region AA and to the driver 12 and are avoided from being disposed between the display region AA and the outer edges of the extended outer shape portions 11EX, it is possible to reduce the frame width while suppressing an increase in the wiring density between the display region AA and the outer edges of the extended outer shape portions 11EX.

Also, the relay wires 42 are disposed so as to overlap the first source wires 27α via the lower-layer-side insulating film 31 and the gate insulating film 33, which are insulating films. With this arrangement, short-circuiting between the relay wires 42 and the first source wires 27α is less likely to occur, when compared with a case in which the relay wires are formed in the same layer as that of the first source wires 27α. Also, when compared with a case in which the relay wires are disposed so as not to overlap the first source wires 27α, it is possible to reduce the arrangement space of the relay wires 42 and the first source wires 27α. This is preferable to improve the aperture ratio of the first pixels PX1. In addition, when compared with a case in which the relay wires are disposed so as not to overlap the first source wires 27α and so as to overlap the pixel electrodes 24 that constitute the first pixels PX1, parasitic capacitances that occur between the relay wires 42 and the pixel electrodes 24 that constitute the first pixels PX1 become less likely to increase.

Also, each second source wire 27β is constituted by the main source wire part (the main pixel wire part) 27β1 connected to the second pixel PX2 and the sub source wire part (the sub pixel wire part) 27β2 disposed so as to overlap the main source wire part 27β1 via the lower-layer-side insulating film 31 and the gate insulating film 33, which are insulating films, and connected to the main source wire part 27β1. With this arrangement, when a signal is supplied to the second source wire 27β, the second pixels PX2 connected to the main source wire part 27β1 are charged to a potential based on the signal. Meanwhile, since the signal supplied to the second source wire 27β passes through the driver-side lead wire 43, the relay wire 42 disposed in the first region A1 in the display region AA, and the opposite-side lead wire 44, distortion due to the wiring resistance is likely to occur. In this respect, since each second source wire 27β has a stacked structure of the main source wire part 27β1 and the sub source wire part 27β2 that overlap each other via the lower-layer-side insulating film 31 and the gate insulating film 33, which are insulating films, and that are connected to each other, it is preferable in that the wiring resistance of the second source wires 27β can be reduced to make distortion less likely to occur in signals, and also, the arrangement space of the second source wires 27β can be reduced to improve the aperture ratio of the second pixels PX2.

Also, the first source wires 27α are disposed in the same layer as that of the main source wire parts 27β1, whereas the relay wires 42 are disposed in the same layer as that of the sub source wire parts 27β2 and are disposed so as to overlap the first source wires 27α via the lower-layer-side insulating film 31 and the gate insulating film 33, which are insulating films. With this arrangement, when compared with a case in which the relay wires are disposed so as not to overlap the first source wires 27α, it is possible to reduce the arrangement space of the relay wires 42 and the first source wires 27α. This is preferable to improve the aperture ratio of the first pixels PX1. Furthermore, the first source wires 27α are disposed in the same layer as that of the main source wire parts 27β1, whereas the relay wires 42 are disposed in the same layer as that of the sub source wire parts 27β2, which is thus preferable to reduce the manufacturing cost, compared with a case in which the first source wires are disposed in a layer different from that of the main source wire parts, and the relay wires are disposed in a layer different from that of the sub source wire parts. In particular, since the first source wires 27α connected to the first pixels PX1 are disposed in the same layer as that of the main source wire parts 27β1 connected to the second pixels PX2, the connection structure of the first pixels PX1 and the first source wires 27α and the connection structure of the second pixels PX2 and the second source wire 27β can be shared.

Also, an end portion of the main source wire part 27β1 and an end portion of the sub source wire part 27β2 in each second source wire 27β are disposed outside the display region AA and are connected to each other through the inter-wiring-line-portion contact hole (a contact hole) CH3 opened and formed in the lower-layer-side insulating film 31 and the gate insulating film 33, which are insulating films. With this arrangement, since the inter-wiring-line-portion contact holes CH3 for providing connection between the main source wire parts 27β1 and the sub source wire parts 27β2 are disposed outside the display region AA, it is possible to avoid a reduction in the aperture ratio of the second pixels PX2, the reduction being caused by the inter-wiring-line-portion contact holes CH3.

Also, the first region A1 is segmented into the middle regions A1A, which are neighboring to the second regions A2, and the opposite-side region A1B, which is disposed at the opposite side to the second region A2 side so that the opposite-side region A1B and the second regions A2 sandwich the middle regions A1A, and the relay wires 42 are selectively disposed in the middle regions A1A. With this arrangement, when compared with a case in which the relay wires are disposed in the opposite-side region A1B, the creepage distances from the driver 12 to the second source wires 27β through the driver-side lead wires 43, the relay wires 42, and the opposite-side lead wires 44 are reduced. This makes distortion due to the wiring resistances less likely to occur in the signals supplied to the second source wires 27β.

Also, the relay wires 42 are disposed so as to overlap the first source wires 27α via the lower-layer-side insulating film 31 and the gate insulating film 33, which are insulating films, and the display device comprises the dummy wires 45 that are selectively disposed in the opposite-side region A1B in the display region AA and are disposed so as to overlap the first source wires 27α via the lower-layer-side insulating film 31 and the gate insulating film 33, which are insulating films. With this arrangement, when compared with a case in which the relay wires are disposed so as not to overlap the first source wires 27α it is possible to reduce the arrangement space of the relay wires 42 and the first source wires 27α. This is preferable to improve the aperture ratio of the first pixels PX1. Meanwhile, parasitic capacitances can occur between the first source wires 27α and the relay wires 42 disposed in the middle regions A1A in the display region AA. In contrast, the dummy wires 45 are disposed so as to overlap the first source wires 27α, disposed in the opposite-side region A1B in the display region AA, via the lower-layer-side insulating film 31 and the gate insulating film 33, which are insulating films, and parasitic capacitances also occur between the first source wires 27α and the dummy wires 45 disposed in the opposite-side region A1B. Accordingly, a difference becomes less likely to occur between parasitic capacitances that occur between the first source wires 27α and the relay wires 42 and parasitic capacitances that occur between the first source wires 27α and the dummy wires 45, so that a display failure due to the difference between the parasitic capacitances becomes less likely to occur.

Also, a constant potential is supplied to the dummy wires 45. With this arrangement, parasitic capacitances that occur between the first source wires 27α and the dummy wires 45 disposed in the opposite-side region A1B in the display region AA become stable.

Also, two or more dummy wires 45 are disposed in the opposite-side region A1B, have respective end portions disposed outside the display region AA, and comprise the short-circuit wires 46 that are positioned between the display region AA and the outer edge of the array substrate 21, that are disposed so as to overlap the respective end portions of the dummy wires 45 via the lower-layer-side insulating film (an insulating film) 31, and that are connected to the dummy wires 45 through the short-circuit contact holes CH4 opened and formed in the lower-layer-side insulating film 31. With this arrangement, the dummy wires 45 are short-circuited by the short-circuit wires 46 connected through the short-circuit contact holes CH4, and also a constant potential is supplied to all the dummy wires 45. This makes the potentials in the dummy wires 45 stable, so that parasitic capacitances that occur between the first source wires 27α and the dummy wires 45 become more stable.

Also, the numbers of first source wires 27α, second source wires 27β, relay wires 42, driver-side lead wires 43, and opposite-side lead wires 44 that are disposed are each two or more. The opposite-side lead wires 44 include the first opposite-side lead wires 44α and the second opposite-side lead wires 44β. The second opposite-side lead wires 44β are disposed in a layer different from that of the first opposite-side lead wires 44α via the lower-layer-side insulating film 31 and the gate insulating film 33, which are insulating films, and are disposed so as to be neighboring to the first opposite-side lead wires 44α. With this arrangement, signals from the driver 12 are supplied to the second source wires 27β via the driver-side lead wires 43, the relay wires 42, and the opposite-side lead wires 44. Since the first opposite-side lead wire 44α and the second opposite-side lead wire 44β that is neighboring thereto are disposed in different layers via the lower-layer-side insulating film 31 and the gate insulating film 33, which are insulating films, it is possible to reduce the arrangement space of the opposite-side lead wires 44. Thus, the frame width between the display region AA and the outer edge of the array substrate 21 at the opposite side to the driver 12 can be kept small.

Also, the relay wires 42 are disposed so as to overlap the first source wires 27α via the lower-layer-side insulating film 31 and the gate insulating film 33, which are insulating films, and the first opposite-side lead wires 44α and the second opposite-side lead wires 44β are disposed in the same layers as those of the relay wires 42 and the first source wires 27α, respectively. With this arrangement, when compared with a case in which the relay wires are disposed so as not to overlap the first source wires 27α, it is possible to reduce the arrangement space of the relay wires 42 and the first source wires 27α. This is preferable to improve the aperture ratio of the first pixels PX1. Furthermore, since the first opposite-side lead wires 44α and the second opposite-side lead wires 44β are disposed in the same layers as those of the relay wires 42 and the first source wires 27α respectively, this is preferable to reduce the manufacturing cost, compared with a case in which the first opposite-side lead wires and the second opposite-side lead wires are disposed in respective layers different from those of the relay wires and the first source wires. In particular, of the first opposite-side lead wires 44α and the second opposite-side lead wires 44β, the opposite-side lead wires disposed in the same layer as that of the relay wires 42 are directly coupled to the relay wires 42, and thus, the connection structure becomes simple.

Also, the second source wires 27β are constituted by the main source wire parts 27β, which are connected to the second pixels PX2, and the sub source wire parts 27β2, which are disposed so as to overlap the main source wire parts 27β1 via the lower-layer-side insulating film 31 and the gate insulating film 33, which are insulating films, and are connected to the main source wire parts 27β1. The first opposite-side lead wires 44α and the second opposite-side lead wires 44β are disposed in the same layers as those of the sub source wire parts 27β2 and the main source wire parts 27β1, respectively. With this arrangement, when a signal is supplied to the second source wire 27β, the second pixels PX2 connected to the main source wire part 27β1 are charged to a potential based on the signal. Meanwhile, since the signal supplied to the second source wire 27β passes through the driver-side lead wire 43, the relay wire 42 disposed in the first region A1 in the display region AA, and the opposite-side lead wire 44, distortion due to the wiring resistance is likely to occur. In this respect, since each second source wire 27β has a stacked structure of the main source wire part 27β1 and the sub source wire part 27β2 that overlap each other via the lower-layer-side insulating film 31 and the gate insulating film 33, which are insulating films, and that are connected to each other, it is preferable in that the wiring resistance of the second source wires 27β can be reduced to make distortion less likely to occur in signals, and also, the arrangement space of the second source wires 27β can be reduced to improve the aperture ratio of the second pixels PX2. Moreover, since the first opposite-side lead wires 44α and the second opposite-side lead wires 44β are disposed in the same layers as those of the sub source wire parts 27β2 and the main source wire parts 27β1 respectively, this is preferable to reduce the manufacturing cost, compared with a case in which the first opposite-side lead wires and the second opposite-side lead wires are disposed in respective layers that differ from those of the main source wire parts and the sub source wire parts. In particular, since each of the first opposite-side lead wires 44α and the second opposite-side lead wires 44β is directly coupled to the source wire part that is included in the main source wire parts 27β1 and the sub source wire parts 27β2 and that is disposed in the same layer, the connection structure becomes simple.

Also, the liquid-crystal panel 11 comprises the gate circuit portions (pixel driving portions) 14 that are disposed at the array substrate 21 between the display region AA and the outer edges of the extended outer shape portions 11EX to drive the first pixels PX1 and the second pixels PX2. With this arrangement, when the gate circuit portions 14 drive the first pixels PX1 and the second pixels PX2, the first pixels PX1 are charged to potentials based on signals supplied through the first source wires 27α, and the second pixels PX2 are charged to potentials based on signals supplied through the second source wires 27β. Since the gate circuit portions 14 are disposed at the array substrate 21 between the display region AA and the outer edges of the extended outer shape portions 11EX, the frame width between the display region AA and the outer edges of the extended outer shape portions 11EX tends to increase. In this respect, since signals are adapted to be supplied to the second source wires 27β in the second regions A2 in the display region AA through the driver-side lead wires 43, the relay wires 42 disposed in the first region A1 in the display region AA, and the opposite-side lead wires 44, and the driver-side lead wires 43 are avoided from being disposed between the display region AA and the outer edges of the extended outer shape portions 11EX, it is possible to keep the frame width small while suppressing an increase in the wiring density between the display region AA and the outer edges of the extended outer shape portions 11EX.

Second Embodiment

A second embodiment of the present invention will be described in conjunction with FIGS. 14 to 17. In this second embodiment, a description will be given of a case in which the connection structure and so on of main source wire parts 127β1 and sub source wire parts 127β2 that constitute second source wires 127β are changed. Redundant descriptions are not given of structures, effects, and advantages that are similar to those in the first embodiment.

Figure 14:
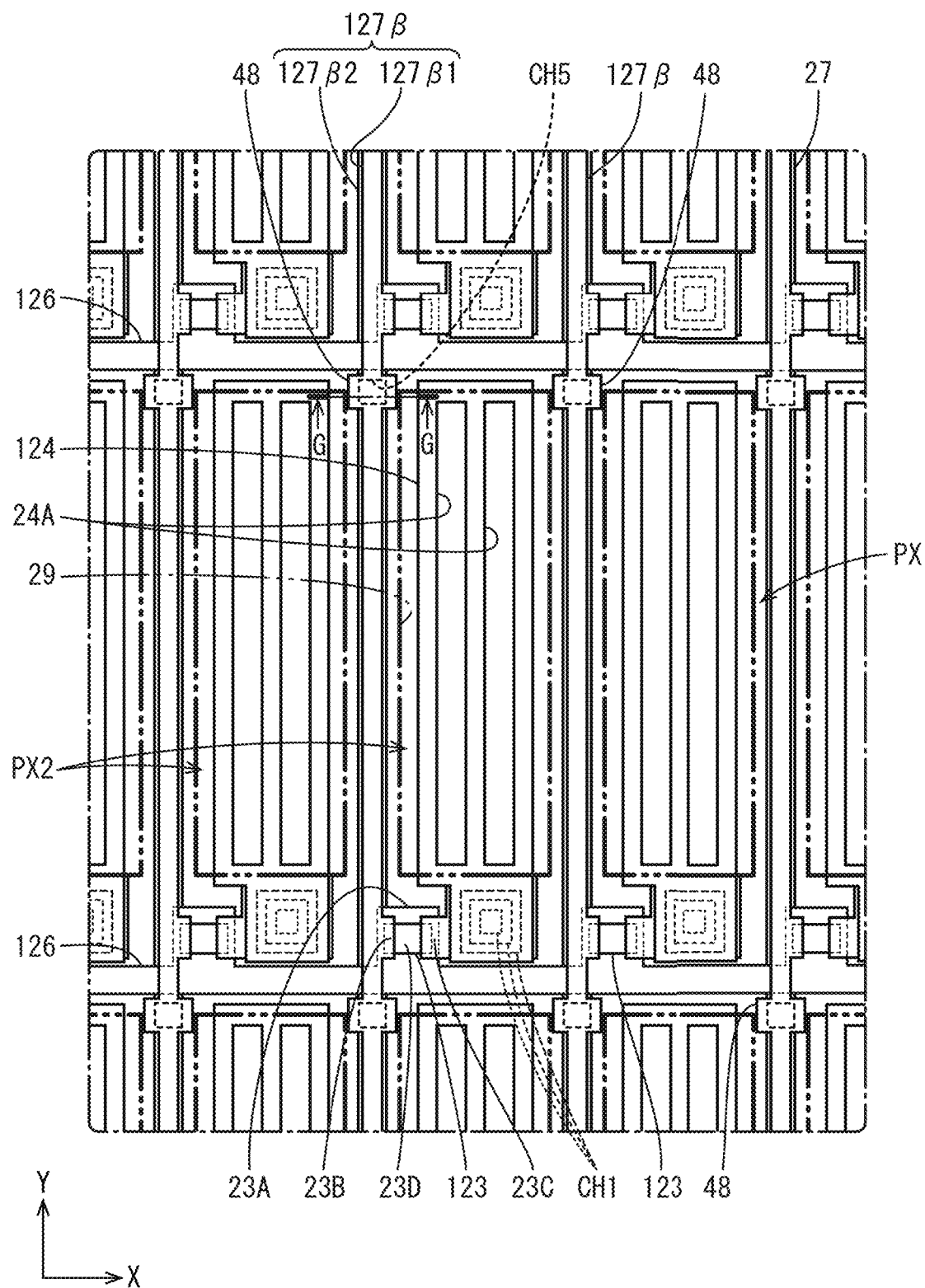
FIG. 14 is a plan view showing a pixel array in the second region at an array substrate that constitutes a liquid-crystal panel according to a second embodiment of the present invention.
Figure 15:
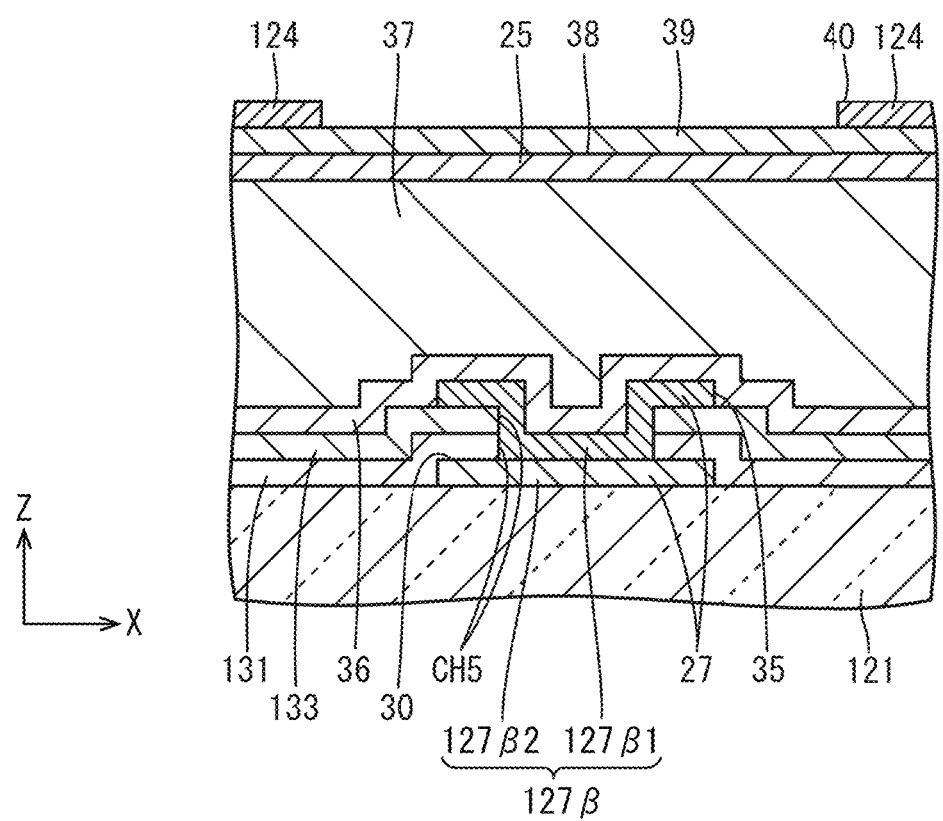
FIG. 15 is a sectional view of the array substrate, taken along line G-G in FIG. 14.

FIG. 14 is a plan view showing a pixel array in the second region A2 at an array substrate 121. FIG. 15 is a sectional view obtained by sectioning the connection portion of the main source wire part 127β1 and the sub source wire part 127β2 that constitute the second source wire 127β in the second region A2 at the array substrate 121. As shown in FIGS. 14 and 15, in each second source wire 127β according to the present embodiment, a portion of the main source wire part 127β1 and a portion of the sub source wire part 127β2, the portions being located in the display region AA and being neighboring to the second pixel PX2 are connected to each other. More specifically, the main source wire part 127β1 and the sub source wire part 127β2 that constitute the second source wire 127β are connected at a position that is neighboring to the opposite side (the lower side shown in FIG. 14) to a TFT 123 side with respect to a gate wire 126 with respect to the Y-axis direction. Increased-width parts 48 whose widths are partly increased are respectively provided at the connection position of the main source wire part 127β1 and the sub source wire part 127β2. The increased-width parts 48, the number of which being equal to the number of gate wires 126 and the number of second pixels PX2 that are provided with respect to the Y-axis direction, are provided for each of the main source wire parts 127β1 and the sub source wire parts 127β2. An inter-wiring-line-portion contact hole CH5 is opened and formed at a position that is located in a lower-layer-side insulating film 131 and a gate insulating film 133 interposed between the main source wire part 127β1 and the sub source wire part 127β2 and that overlaps the increased-width parts 48 of the main source wire part 127β1 and the sub source wire part 127β2. The increased-width parts 48 of the main source wire part 127β1 and the sub source wire part 127β2 are connected to each other through the inter-wiring-line-portion contact hole CH5. The number of inter-wiring-line-portion contact holes CH5 that are placed matches the number of increased-width parts 48 that are placed. Since the increased-width parts 48 make it possible to sufficiently ensure the connection areas of the main source wire parts 127β1 and the sub source wire parts 127β2, high connection reliability is obtained. Furthermore, a large number of increased-width parts 48 and a large number of inter-wiring-line-portion contact holes CH5 are placed in the second regions A2 in the display region AA, as described above, this is preferable to enhance the redundancy and the connection reliability of the main source wire parts 127β1 and the sub source wire parts 127β2. On the other hand, a parasitic capacitance that occurs between the main source wire part 127β1 and the sub source wire part 127β2, which constitute the second source wires 127β, and the pixel electrode 124, which constitutes the second pixels PX2, tends to increase owing to the increased-width part 48.

Figure 16:
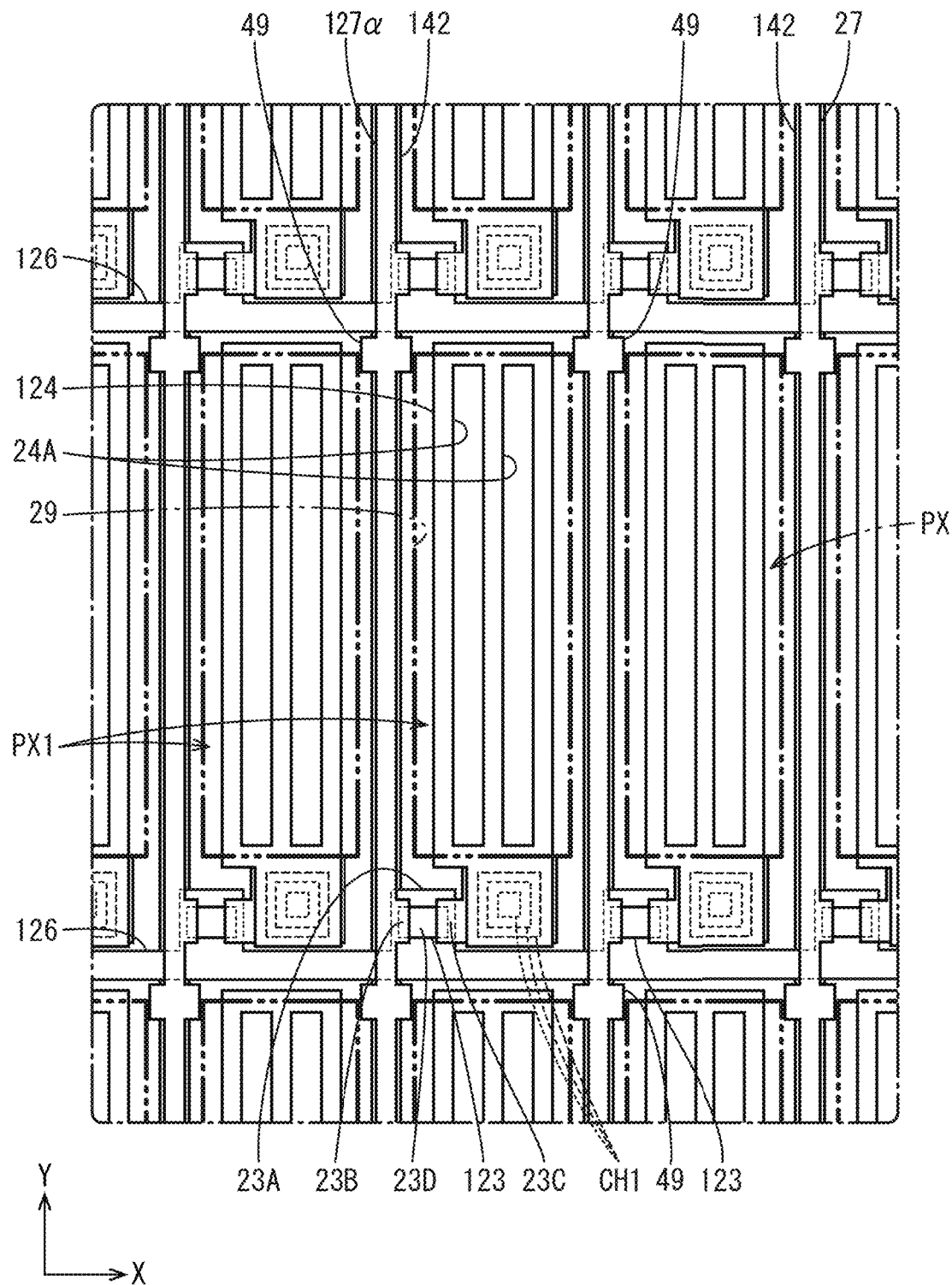
FIG. 16 is a plan view showing a pixel array in the middle region in a first region at the array substrate that constitutes the liquid-crystal panel.
Figure 17:
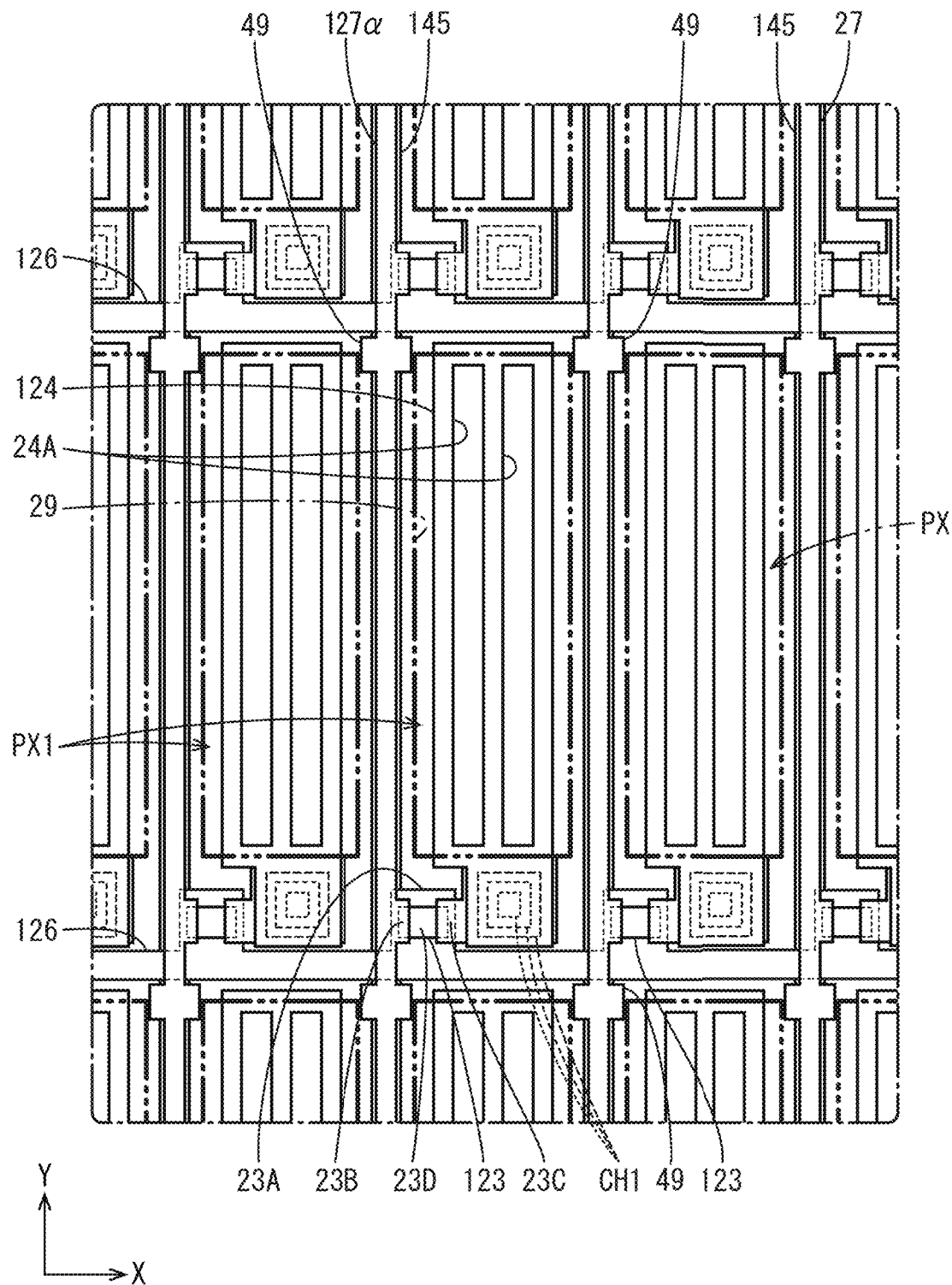
FIG. 17 is a plan view showing a pixel array in an opposite-side region in the first region at the array substrate that constitutes the liquid-crystal panel.

FIG. 16 is a plan view showing a pixel array in the middle region A1A in the first region A1 at the array substrate 121. FIG. 17 is a plan view showing a pixel array in the opposite-side region A1B in the first region A1 at the array substrate 121. First source wires 127α disposed in the first region A1 have dummy increased-width parts 49 whose width is the same as that of the increased-width parts 48, as shown in FIGS. 16 and 17. As shown in FIG. 16, relay wires 142 that are disposed in the middle region A1A so as to overlap the first source wires 127α are provided with dummy increased-width parts 49, as in the first source wires 127α. As shown in FIG. 17, dummy wires 145 that are disposed in the opposite-side region A1B so as to overlap the first source wires 127α are also provided with dummy increased-width parts 49, as in the first source wires 127α. The dummy increased-width parts 49 are disposed at positions that are neighboring to an opposite side (the lower side shown in FIG. 16) to the TFT 123 side with respect to the gate wire 126 with respect to the Y-axis direction. The dummy increased-width parts 49, the number of which being equal to the number of gate wires 126 and the number of first pixels PX1 that are provided with respect to the Y-axis direction, are provided for the first source wires 127α, the relay wires 142, and the dummy wires 145. As described above, since the first source wires 127α, the relay wires 142, and the dummy wires 145 have the dummy increased-width parts 49 whose width is the same as that of the increased-width parts 48, parasitic capacitances that occur between the first source wires 127α, the relay wires 142, and the dummy wires 145 and the pixel electrodes 124 that constitute the first pixels PX1 also increase. Thus, since a difference becomes less likely to occur between a parasitic capacitance that occurs between the main source wire part 127β1 and the sub source wire part 127β2 that constitutes the second source wire 127β and the pixel electrode 124 that constitutes the second pixel PX2 and a parasitic capacitance that occurs between the first source wire 127α, the relay wire 142, and the dummy wire 145 and the pixel electrode 124 that constitutes the first pixel PX1, display ununiformity between the first region A1 and the second regions A2, the display ununiformity being caused by the difference between the parasitic capacitances, becomes less likely to be viewed.

As described above, according to the present embodiment, in the second source wire 127β, a portion of the main source wire part 127β1 and a portion of the sub source wire part 127β2, the portions being neighboring to the second pixel PX2, are connected to each other through the inter-wiring-line-portion contact hole (contact hole) CH5 opened and formed in the lower-layer-side insulating film 131 and the gate insulating film 133, which are insulating films. With this arrangement, since the inter-wiring-line-portion contact holes CH5 for providing connection between the main source wire parts 127β1 and the sub source wire parts 127β2 are disposed in the display region AA, this is preferable to increase the number of inter-wiring-line-portion contact holes CH5 that are placed. This makes it possible to enhance the redundancy and the connection reliability of the main source wire parts 127β1 and the sub source wire parts 127β2.

Also, each second source wire 127β has the increased-width part 48 at a position where the main source wire part 127β1 and the sub source wire part 127β2 overlap the inter-wiring-line-portion contact hole CH5, and each first source wire 127α has the dummy increased-width part 49 whose width is the same as that of the increased-width part 48. With this arrangement, since the increased-width parts 48 of the main source wire part 127β1 and the sub source wire part 127β2 are connected to each other through the inter-wiring-line-portion contact hole CH5, the connection reliability of the main source wire part 127β1 and the sub source wire part 127β2 increases. A parasitic capacitance that occurs between the second source wire 127β and the pixel electrode 124 that constitutes the second pixel PX2 tends to increase owing to the increased-width part 48 as described above, and since the first source wire 127α has the dummy increased-width part 49 whose width is the same as that of the increased-width part 48, a parasitic capacitance that occurs between the first source wire 127α and the pixel electrode 124 that constitutes the first pixel PX1 also increases. Thus, since a difference becomes less likely occur between a parasitic capacitance that occurs between the second source wire 127β and the pixel electrode 124 that constitutes the second pixel PX2 and a parasitic capacitance that occurs between the first source wire 127α and the pixel electrode 124 that constitutes the first pixel PX1, a display failure due to the difference between the parasitic capacitances becomes less likely to occur.

Third Embodiment

A third embodiment of the present invention will be described in conjunction with FIGS. 18 to 25. In the third embodiment, a description will be given of an array substrate 51 comprised by an organic EL display panel (a display device) 50. Redundant descriptions are not given of structures, effects, and advantages that are similar to those in the first embodiment.

Figure 18:
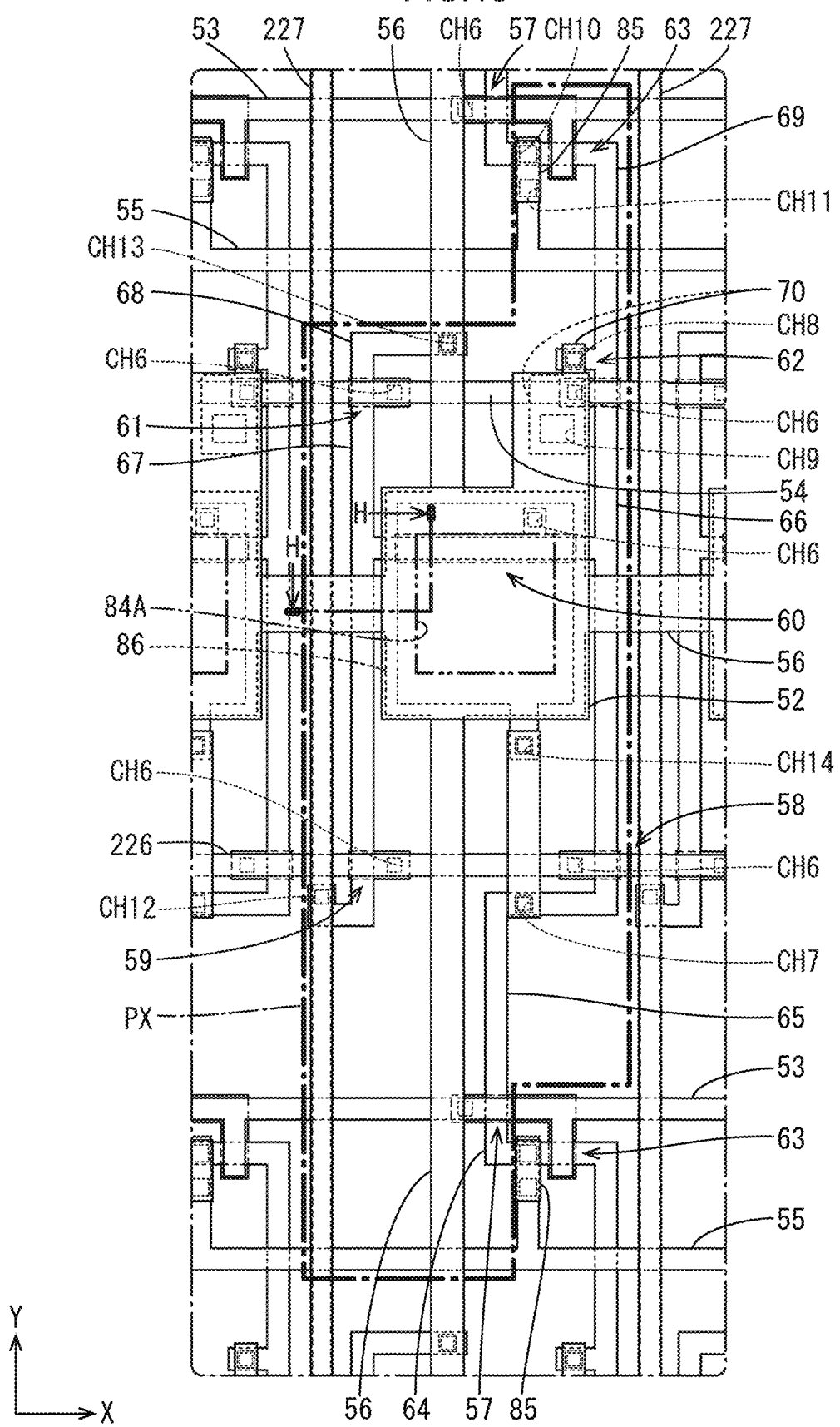
FIG. 18 is a plan view showing a pixel array at an array substrate that constitutes an organic EL display panel according to a third embodiment of the present invention.

The organic EL display panel 50 according to the present embodiment comprises an array substrate 51 at which various wires and so on are formed, as shown in FIG. 18. FIG. 18 is a plan view showing a pixel array on the array substrate 51. In the present embodiment, an organic EL device layer (light-emitting portions), a cathode-side electrode layer, a sealing layer, and so on are stacked on the array substrate 51. The organic EL device layer has a known configuration made of a hole injection layer, a hole transporting layer, an electron injection layer, an electron transporting layer, a light-emitting layer, and so on. The light-emitting layer is sandwiched between the hole transporting layer and the electron transporting layer and emits light by exciting light-emitting material, contained in the light-emitting layer, with energy generated through coupling of holes and electrons in the light-emitting layer. The light emitted by the light-emitting layer is adapted to be output to the opposite side to the array substrate 51 side with respect to the Z-axis direction (a thickness direction). That is, the organic EL display panel 50 according to the present embodiment is the so-called top-emission type. A detailed configuration of the array substrate 51 will be described below.

As shown in FIG. 18, the array substrate 51 is provided with anode-side electrodes (electrode portions) 52 that constitute the pixels PX, which are display units. The anode-side electrodes 52 function as "reflection electrodes" that reflect the light, emitted by the light-emitting layer, to direct the light to the opposite side to the array substrate 51 side with respect to the Z-axis direction. Each anode-side electrode 52 has a generally square shape in plan view, and two or more anode-side electrodes 52 are arrayed in a matrix side-by-side with gaps therebetween along the X-axis direction and the Y-axis direction. Two or more gate wires 226 and two or more source wires 227 are arrayed so as to partition between the anode-side electrodes 52. Sub gate wires 53, EM wires 54, and initialization power-supply wires 55 that extend in a form in which they are parallel to the respective gate wires 226 are provided at the array substrate 51. The sub gate wires 53 and the initialization power-supply wires 55 are disposed with gaps therebetween at the opposite side to the anode-side electrodes 52 side with respect to the gate wires 226 with respect to the Y-axis direction. The initialization power-supply wires 55 are disposed with gaps therebetween at the opposite side to the gate wires 226 side with respect to the sub gate wires 53 with respect to the Y-axis direction and are each arranged sandwiched between the sub gate wire 53 and the EM wire 54 related to the ((n−1)th) pixel PX that is the previous one in a scan order. In the present embodiment, the scan of the pixels PX is adapted to be performed from the lower side to the upper side shown in FIG. 18. The EM wires 54 are disposed with gaps therebetween at the opposite side to the gate wires 226 side with respect to the anode-side electrodes 52 with respect to the Y-axis direction. In addition, anode-side power-supply wires (power-supply wires) 56 that have a lattice shape in which they extend along the X-axis direction and the Y-axis direction and that are disposed so as to lie across all the anode-side electrodes 52 are provided at the array substrate 51. Detailed functions and so on of the wires 53 to 56 are described later.

Figure 19:
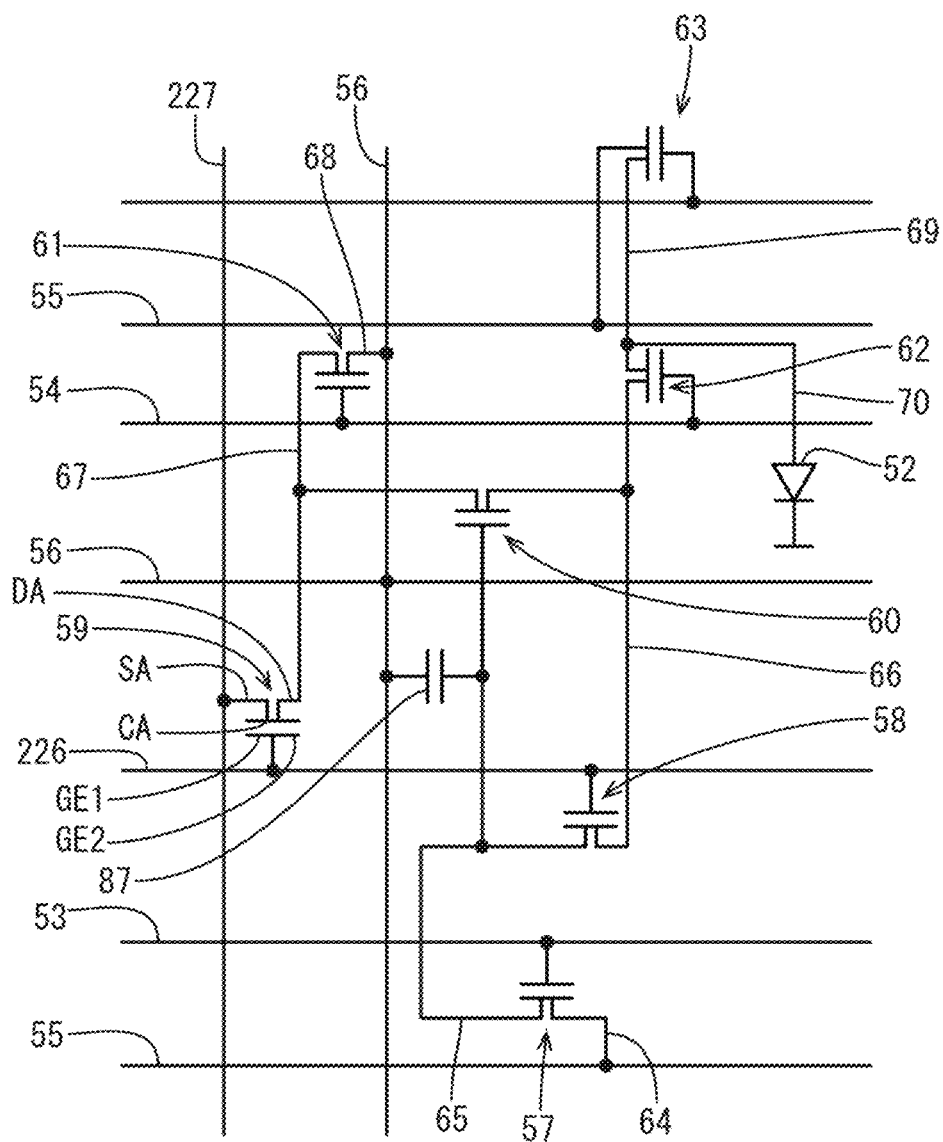
FIG. 19 is a circuit diagram showing an electrical configuration according to pixels on the array substrate.

Seven TFTs 57 to 63 are provided for each pixel PX at the array substrate 51 in order to apply voltages to the above-described anode-side electrode 52, as shown in FIGS. 18 and 19. FIG. 19 is a circuit diagram showing an electrical configuration according to the pixels PX at the array substrate 51. The seven TFTs 57 to 63 each have a lower-layer-side gate electrode (a first gate electrode) GE1, a source region SA, a drain region DA, a channel region CA, and an upper-layer-side gate electrode (a second gate electrode) GE2 and are each a double-gate type TFT. Of these regions and the electrodes, the lower-layer-side gate electrode GE1 and the upper-layer-side gate electrode GE2 are connected to each other. Also, the channel region CA is connected to the source region SA and the drain region DA.

As shown in FIGS. 18 and 19, in the first TFT 57 of the seven TFTs 57 to 63, the lower-layer-side gate electrode GE1 and the upper-layer-side gate electrode GE2 are connected to the sub gate wire 53, the source region SA is connected to a first connection wire 64, and the drain region DA is connected to a second connection wire 65. In the second TFT 58, the lower-layer-side gate electrode GE1 and the upper-layer-side gate electrode GE2 are connected to the gate wire 226, the source region SA is connected to a third connection wire 66, and the drain region DA is connected to the second connection wire 65. In the third TFT 59, the lower-layer-side gate electrode GE1 and the upper-layer-side gate electrode GE2 are connected to the gate wire 226 that is the same as for the second TFT 58, the source region SA is connected to the source wire 227, and the drain region DA is connected to a fourth connection wire 67. In the fourth TFT 60, the lower-layer-side gate electrode GE1 and the upper-layer-side gate electrode GE2 are connected to the second connection wire 65, the source region SA is connected to the fourth connection wire 67, and the drain region DA is connected to the third connection wire 66. In the fifth TFT 61, the lower-layer-side gate electrode GE1 and the upper-layer-side gate electrode GE2 are connected to the EM wire 54, the source region SA is connected to a fifth connection wire 68, and the drain region DA is connected to the fourth connection wire 67. In the sixth TFT 62, the lower-layer-side gate electrode GE1 and the upper-layer-side gate electrode GE2 are connected to the EM wire 54 that is the same as for the fifth TFT 61, the source region SA is connected to the third connection wire 66, and the drain region DA is connected to a sixth connection wire 69. In the seventh TFT 63, the lower-layer-side gate electrode GE1 and the upper-layer-side gate electrode GE2 are connected to the sub gate wire 53 comprised by the ((n+1)th) pixel PX that is the subsequent one in the scan order, the source region SA is connected to the first connection wire 64 comprised by the ((n+1)th) pixel PX that is the subsequent one in the scan order, and the drain region DA is connected to the sixth connection wire 69.

As shown in FIGS. 18 and 19, the first connection wire 64 is connected to the source region SA of the first TFT 57, the source region SA of the seventh TFT 63 comprised by the ((n−1)th) pixel PX that is the previous one in the scan order, and the initialization power-supply wire 55. The second connection wire 65 is connected to the drain region DA of the first TFT 57, the drain region DA of the second TFT 58, and the lower-layer-side gate electrode GE1 and the upper-layer-side gate electrode GE2 of the fourth TFT 60. The third connection wire 66 is connected to the source region SA of the second TFT 58, the drain region DA of the fourth TFT 60, and the source region SA of the sixth TFT 62. The fourth connection wire 67 is connected to the drain region DA of the third TFT 59, the source region SA of the fourth TFT 60, and the drain region DA of the fifth TFT 61. The fifth connection wire 68 is connected to the source region SA of the fifth TFT 61 and the anode-side power-supply wire 56. The sixth connection wire 69 is connected to the drain region DA of the sixth TFT 62 and the drain region DA of the seventh TFT 63. In addition, the array substrate 51 comprises a seventh connection wire 70, which is connected to the sixth connection wire 69 and the anode-side electrode 52.

Figure 20:
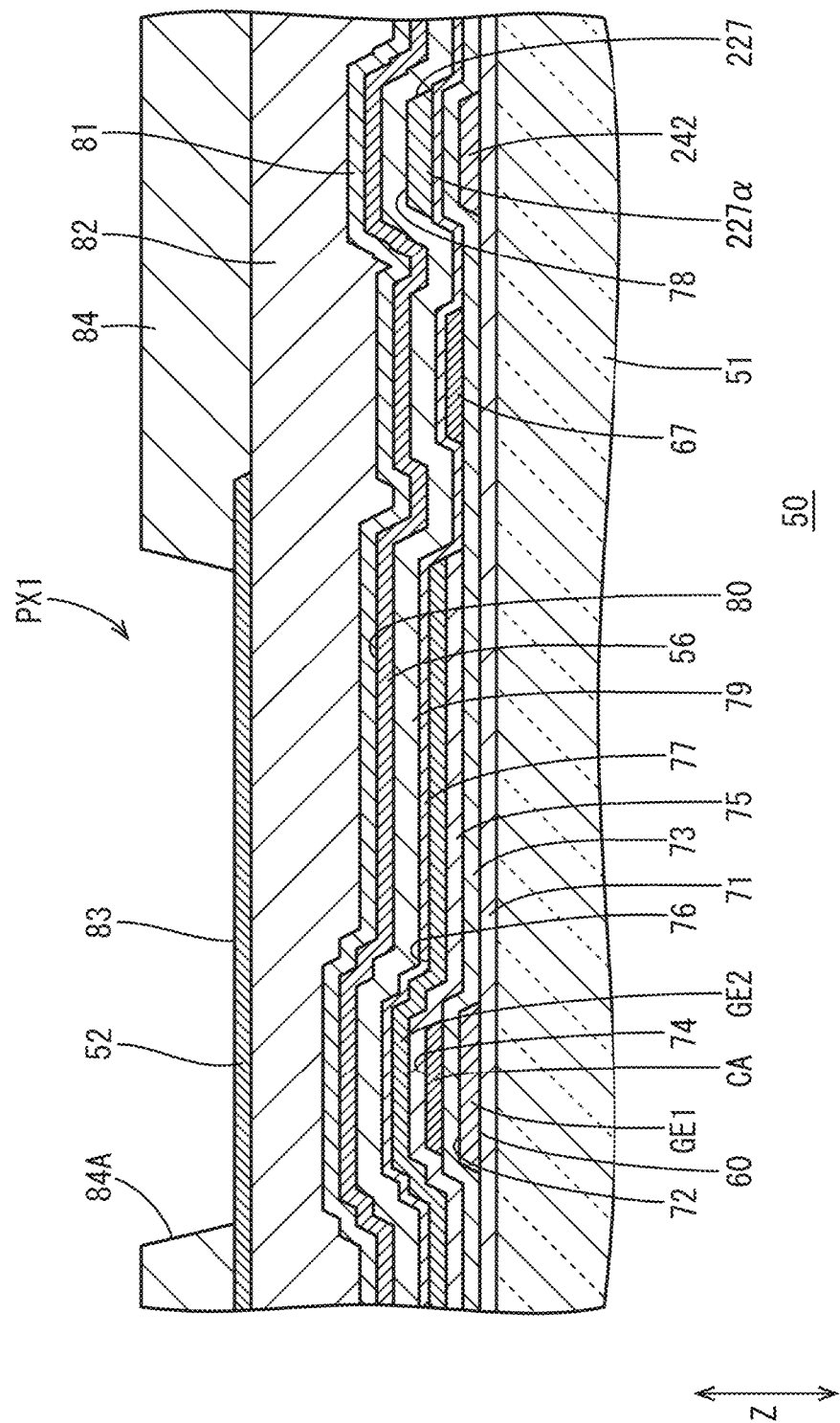
FIG. 20 is a sectional view of the middle region in the first region at the array substrate, taken along line H-H in FIG. 18.

Next, the films stacked on the array substrate 51 will be described using FIG. 20. FIG. 20 is a sectional view obtained by sectioning the vicinity of the first pixel PX1, a first source wire 227α, and a relay wire 242 in the middle region A1A in the first region A1 at the array substrate 51. As shown in FIG. 20, the array substrate 51 comprises a basecoat film 71, a first metal film 72, a lower-layer-side gate insulating film 73, a semiconductor film 74, an upper-layer-side gate insulating film 75, a second metal film 76, a first interlayer insulating film 77, a third metal film 78, a second interlayer insulating film 79, a fourth metal film 80, a third interlayer insulating film 81, a planarization film 82, a fifth metal film 83, and a protection film 84 in order from the lower layer side. The first metal film 72, the second metal film 76, the third metal film 78, the fourth metal film 80, and the fifth metal film 83 are each formed of a single layer film made of one type of metallic material selected from copper, titanium, aluminum, molybdenum, tungsten, and so on or a stacked film or alloy made of different types of metallic material to thereby have an electrical conductivity property and a light-shielding property. The semiconductor film 74 is, for example, an oxide semiconductor film using oxide semiconductor as its material. The basecoat film 71, the lower-layer-side gate insulating film 73, the upper-layer-side gate insulating film 75, the first interlayer insulating film 77, the second interlayer insulating film 79, and the third interlayer insulating film 81 are each made of inorganic material. The planarization film 82 and the protection film 84 are each made of organic material, such as polyimide. The protection film 84 covers an outer-peripheral end portion of the anode-side electrode 52 and has an opening at a portion that overlaps a center-side portion of the anode-side electrode 52, and an organic EL device layer is adapted to be vapor-deposited on the anode-side electrode 52 through this opening portion 84A.

Figure 21:
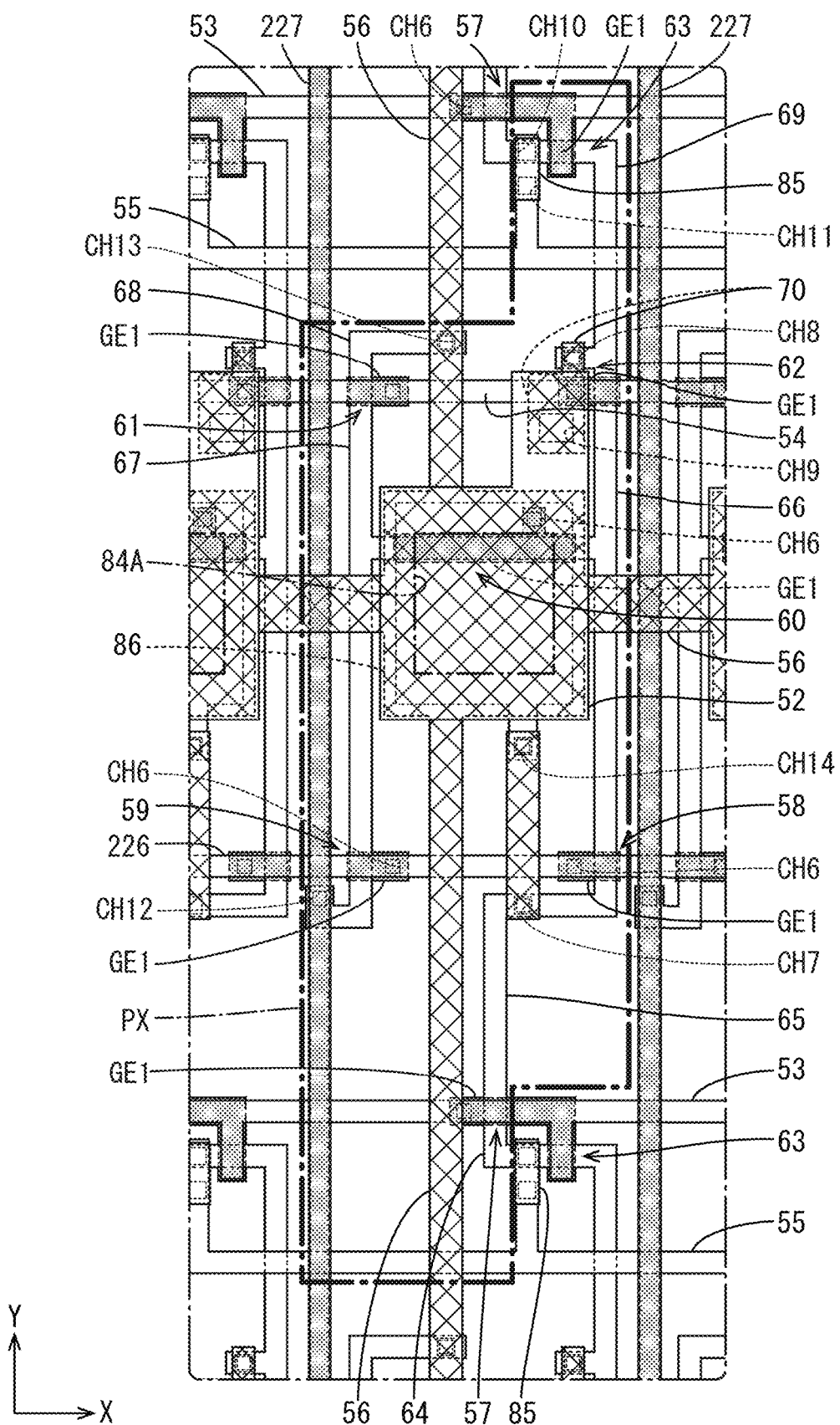
FIG. 21 is a plan view mainly showing patterns of a first metal film and a fourth metal film comprised by the array substrate.
Figure 22:
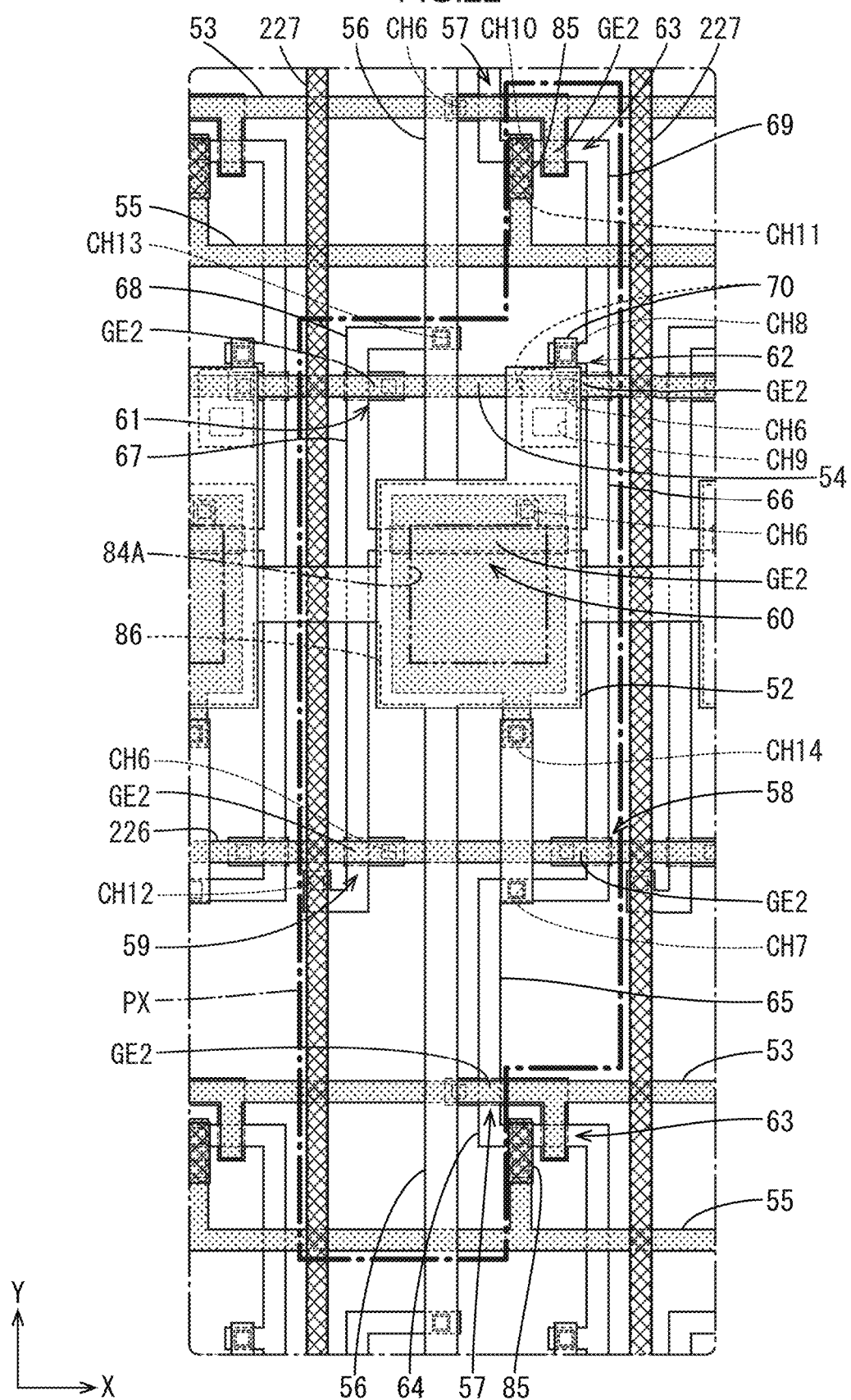
FIG. 22 is a plan view mainly showing patterns of a second metal film and a third metal film comprised by the array substrate.
Figure 23:
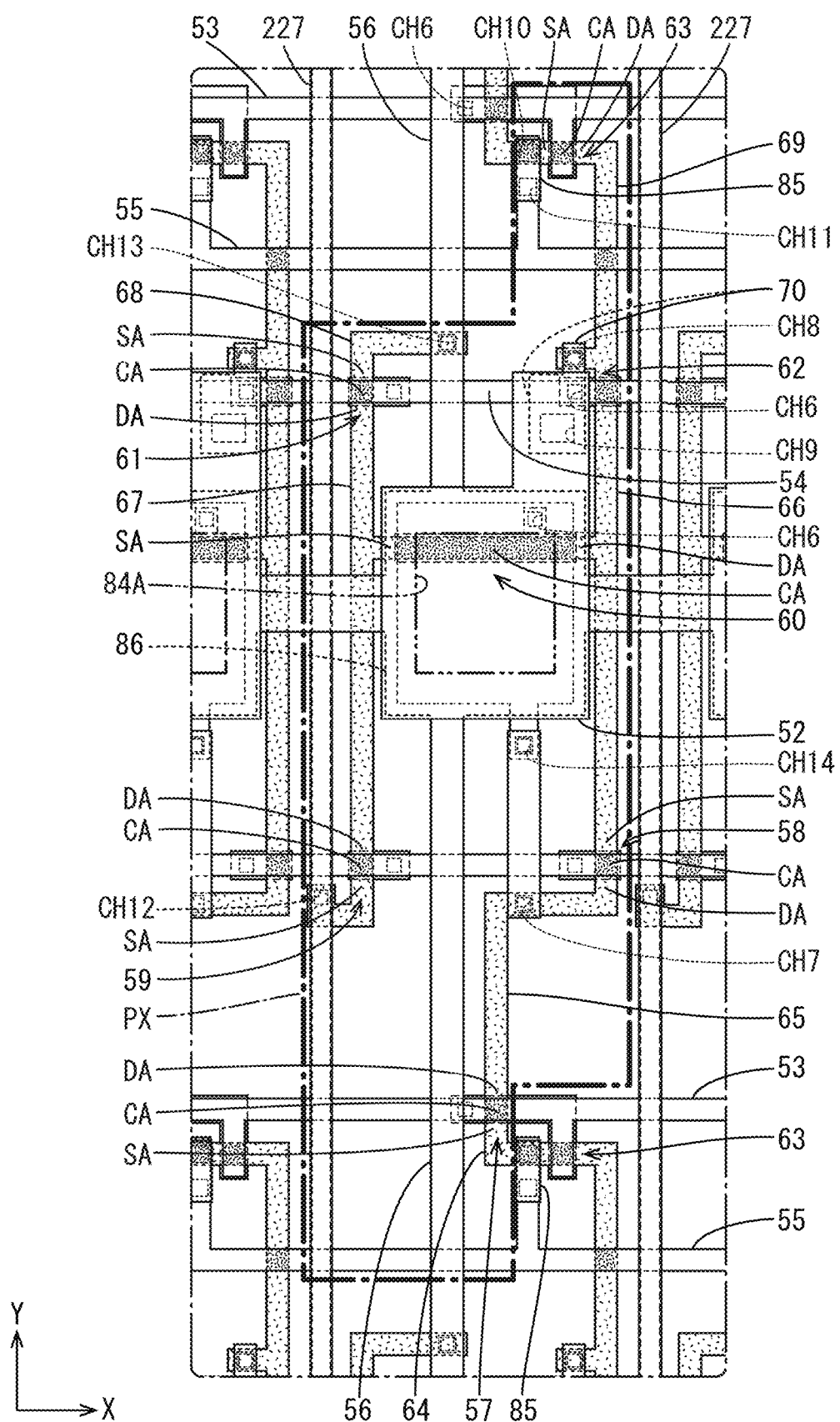
FIG. 23 is a plan view mainly showing a pattern of semiconductor films comprised by the array substrate.
Figure 24:
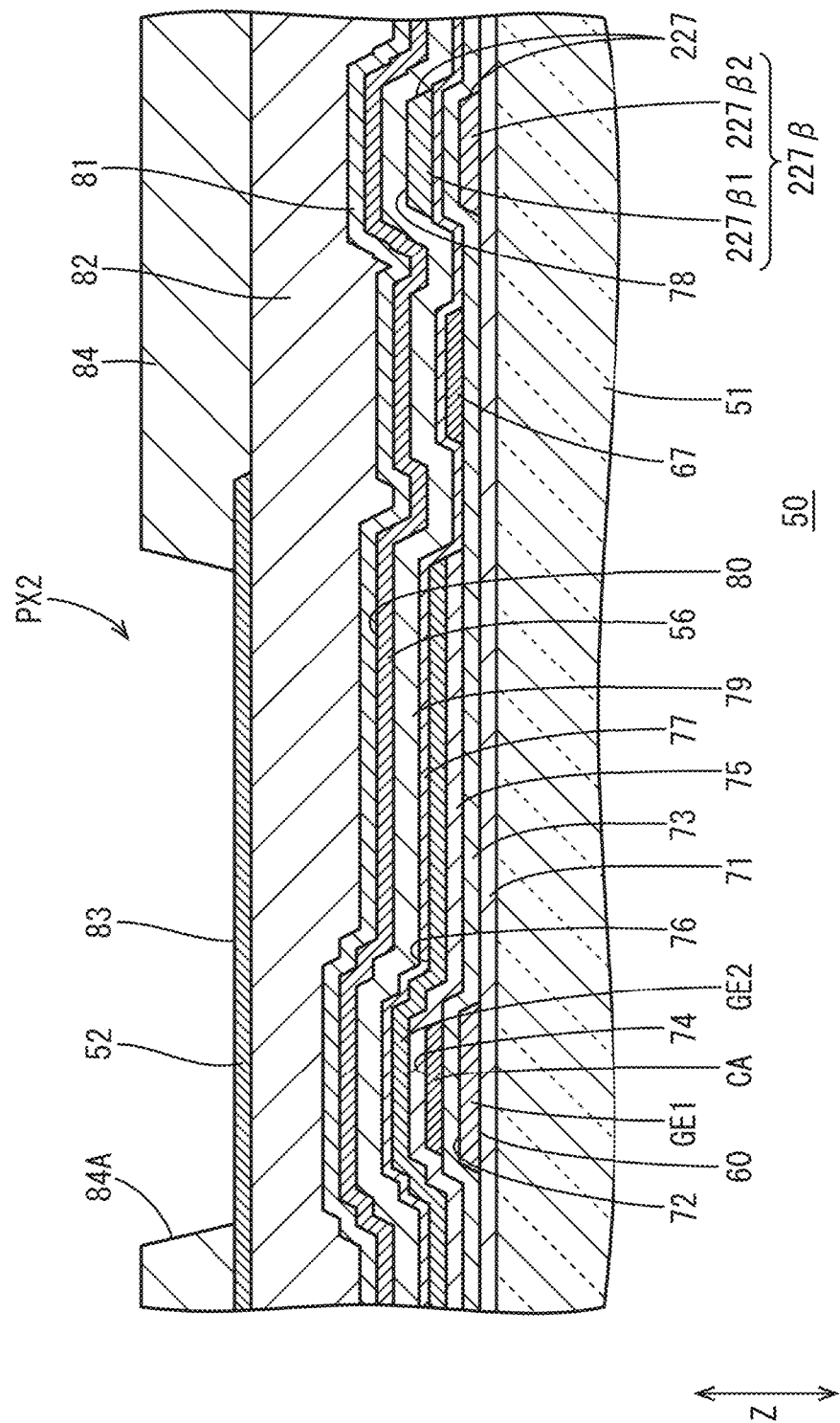
FIG. 24 is a sectional view of the second region at the array substrate, taken along line H-H in FIG. 18.
Figure 25:
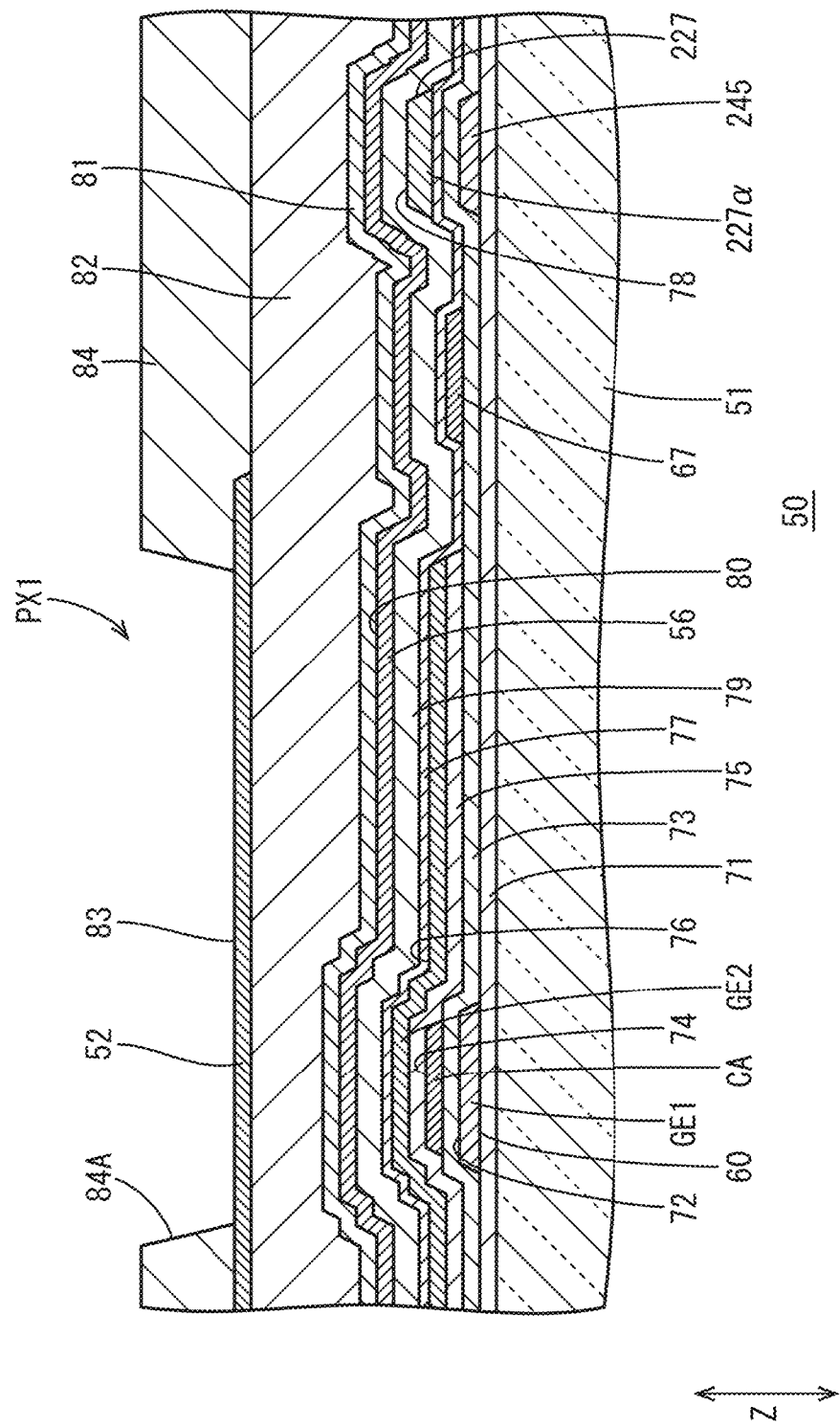
FIG. 25 is a sectional view of the opposite-side region in the first region at the array substrate, taken along line H-H in FIG. 18.

Subsequently, which structures of the array substrate 51 the above-described metal films 72, 76, 78, 80, and 83 and the semiconductor film 74 constitute will be described using FIGS. 20 to 25. FIG. 21 is a plan view showing the first metal film 72 and the fourth metal film 80 by hatching and showing other metal films 76, 78, and 83 and the semiconductor film 74 by unhatching. FIG. 22 is a plan view showing the second metal film 76 and the third metal film 78 by hatching and showing other metal films 72, 80, and 83 and the semiconductor film 74 by unhatching. FIG. 23 is a plan view showing the semiconductor film 74 by hatching and showing the metal films 72, 76, 78, 80, and 83 by unhatching. FIG. 24 is a sectional view obtained by sectioning the vicinity of the second pixel PX2, and a second source wire 227β in the second region A2 at the array substrate 51. FIG. 25 is a sectional view obtained by sectioning the vicinity of the first pixel PX1, the first source wire 227α, and a dummy wire 245 in the opposite-side region A1B in the first region A1 at the array substrate 51. As shown in FIGS. 20, 21, 24, and 25, the first metal film 72 constitutes the lower-layer-side gate electrode GE1 of each of the TFTs 57 to 63, the relay wire 242, a sub source wire part 227β2 of the second source wire 227β, the dummy wire 245, and so on. As shown in FIGS. 20 and 22, the second metal film 76 constitutes the gate wire 226, the sub gate wire 53, the EM wire 54, the initialization power-supply wire 55, the upper-layer-side gate electrode GE2 of each of the TFTs 57 to 63, and so on. As shown in FIGS. 20, 22, 24, and 25, the third metal film 78 constitutes the first source wire 227α, a main source wire part 227β1 of the second source wire 227β, and so on. As shown in FIG. 20, in the middle region A1A in the first region A1, the relay wire 242 and the first source wire 227α are arranged overlapping each other with the lower-layer-side gate insulating film 73 and the first interlayer insulating film 77 being interposed therebetween. As shown in FIG. 24, in the second region A2, the main source wire part 227β1 and the sub source wire part 227β2, which constitute the second source wire 227β, are arranged overlapping each other with the lower-layer-side gate insulating film 73 and the first interlayer insulating film 77 being interposed therebetween. As shown in FIG. 25, in the opposite-side region A1B in the first region A1, the dummy wire 245 and the first source wire 227α are arranged overlapping each other with the lower-layer-side gate insulating film 73 and the first interlayer insulating film 77 being interposed therebetween. With the above-described configuration, the array substrate 51 in the organic EL display panel 50 can also obtain effects and advantages that are similar to those in the first embodiment described above. Also, as shown in FIG. 21, the fourth metal film 80 constitutes the anode-side power-supply wire 56, the seventh connection wire 70, and so on. The fifth metal film 83 constitutes the anode-side electrode 52 and so on.

Also, as shown in FIGS. 21 and 22, the lower-layer-side gate electrode GE1 and the upper-layer-side gate electrode GE2 of each of the TFTs 57 to 63 are connected through a gate contact hole CH6 opened and formed in the lower-layer-side gate insulating film 73 and the upper-layer-side gate insulating film 75. Although the upper-layer-side gate electrode GE2 of the fourth TFT 60, the upper-layer-side gate electrode GE2 being constituted by the second metal film 76, is smaller than the anode-side electrode 52, the upper-layer-side gate electrode GE2 is arranged in a plane so as to overlap most of the anode-side electrode 52. Part of the gate wire 226 constitutes the upper-layer-side gate electrodes GE2 of the second TFT 58 and the third TFT 59, part of the sub gate wire 53 constitutes the upper-layer-side gate electrodes GE2 of the first TFT 57 and the seventh TFT 63, and part of the EM wire 54 constitutes the upper-layer-side gate electrodes GE2 of the fifth TFT 61 and the sixth TFT 62.

As shown in FIG. 23, the semiconductor film 74 constitutes most of the source region SA, the drain region DA, and the channel region CA of each of the TFTs 57 to 63 and the connection wires 64 to 70. The resistances of portions (portions that do not overlap the second metal film 76) of the semiconductor film 74 are reduced in a manufacturing process, and the semiconductor film 74 is constituted by reduced-resistance regions and un-reduced resistance regions. Specifically, the semiconductor film 74 is patterned so as to have a predetermined plane shape and is then subjected to resistance reduction processing using the upper-layer-side gate insulating film 75 and the second metal film 76, which are stacked and formed at the upper layer side, as a mask. In the semiconductor film 74, portions (portions that do not overlap the second metal film 76) that are exposed without being covered by the second metal film 76 are the reduced-resistance regions, and portions that are covered by the second metal film 76 (portions that overlap the second metal film 76) are un-reduced resistance regions. In FIG. 23, the reduced-resistance regions and the un-reduced resistance regions in the semiconductor film 74 differ from each other in hatching. The reduced-resistance regions in the semiconductor film 74 have a resistivity of, for example, about $1/10000000000$ to $1/100$, which is significantly low compared with the un-reduced resistance regions, and function as electrical conductors. The reduced-resistance regions in the semiconductor film 74 constitute most of the source regions SA and the drain regions DA of the TFTs 57 to 63 and the connection wires 64 to 70 and so on. Although the un-reduced resistance regions in the semiconductor film 74 allow charge to move under a particular condition (when a scan signal is supplied to each of the gate electrodes GE1 and GE2), the reduced-resistance regions allow charge to always move and function as electrical conductors. The un-reduced resistance regions in the semiconductor film 74 constitute the channel regions CA of the TFTs 57 to 63.

The entire area of each of the first connection wire 64, the third connection wire 66, the fourth connection wire 67, the fifth connection wire 68, and the sixth connection wire 69 does not overlap the second metal film 76 and is constituted by the reduced-resistance region in the semiconductor film 74, as shown in FIG. 23. The second connection wire 65 is constituted by the reduced-resistance region in the semiconductor film 74, except for a portion that crosses the gate wire 226 and that is constituted by the fourth metal film 80, and the portion constituted by the fourth metal film 80 and a portion constituted by the reduced-resistance region in the semiconductor film 74 are connected through a contact hole CH7 for the second connection wire, the contact hole CH7 being opened and formed in the insulating films 77 and 79 interposed between the portions. A portion that is included in the seventh connection wire 70 and that branches from the sixth connection wire 69 has a portion constituted by the reduced-resistance region in the semiconductor film 74 and another portion constituted by the fourth metal film 80, and these portions are connected through a contact hole CH8 for the seventh connection wire, the contact hole CH 8 being opened and formed in the insulating films 77 and 79 interposed between the portions. The portion included in the seventh connection wire 70 and constituted by the fourth metal film 80 is connected to a portion (a portion that protrudes to the sixth TFT 62 side with respect to the Y-axis direction) of the anode-side electrode 52, the portion being constituted by the fifth metal film 83, through a contact hole CH9 for the anode-side electrode, the contact hole CH9 being opened and formed in the third interlayer insulating film 81 and the planarization film 82. Also, a connecting electrode 85 constituted by the third metal film 78 is provided so as to overlap both the first connection wire 64 and the initialization power-supply wire 55 constituted by the second metal film 76. The connecting electrode 85 is connected to the overlapping initialization power-supply wire 55 through a contact hole CH11 for the initialization power-supply wire, the contact hole CH11 being opened and formed in the first interlayer insulating film 77 interposed between the connecting electrode 85 and the overlapping initialization power-supply wire 55. The first connection wire 64 is connected to the connecting electrode 85 through a contact hole CH10 for the first connection wire, the contact hole CH10 being opened and formed in the first interlayer insulating film 77 interposed between the first connection wire 64 and the connecting electrode 85. The source region SA included in the third TFT 59 and constituted by the reduced-resistance region in the semiconductor film 74 is connected to the source wire 227 (the first source wire 227α and the main source wire part 227β1), constituted by the third metal film 78, through a source contact hole CH12 opened and formed in the first interlayer insulating film 77 interposed between the source region SA and the source wire 227.

As shown in FIG. 21, the anode-side power-supply wire 56 has a capacitance forming portion 86, which has a generally square shape and which overlaps the anode-side electrode 52 and the upper-layer-side gate electrode GE2 of the fourth TFT 60, and this capacitance forming portion 86 is smaller than the anode-side electrode 52 and is larger than the upper-layer-side gate electrode GE2 of the fourth TFT 60. Thus, an electrostatic capacitance (a storage capacitance) 87 is formed between the capacitance forming portion 86 of the anode-side power-supply wire 56 and the upper-layer-side gate electrode GE2 of the fourth TFT 60 (see FIG. 19). The anode-side power-supply wire 56 is connected to the fifth connection wire 68 through a contact hole CH13 for the anode-side power-supply wire, the contact hole CH13 being opened and formed in the insulating film 77 and 79. Also, the upper-layer-side gate electrode GE2 of the fourth TFT 60 and the portion included in the second connection wire 65 and constituted by the fourth metal film 80 are connected to each other through a contact hole CH14 opened and formed in the insulating films 77 and 79 interposed between the upper-layer-side gate electrode GE2 and that portion.

Effects according to an organic EL display device 50 having a configuration as described above will be described using FIGS. 18 and 19. First, an off signal is input to the EM wire 54 related to the nth pixel PX. This puts the fifth TFT 61 and the sixth TFT 62 related to the nth pixel PX into an on state (a non-driven state). Next, scan signals are supplied to the gate wire 226 related to the (n−1)th pixel PX (the previous one in the scan order) and the sub gate wire 53 related to the nth pixel PX at the same timing. At this point in time, since the first TFT 57 related to the nth pixel PX is driven, the initialization power-supply wire 55 and the second connection wire 65 become electrically continuous. In response, an initialization signal transmitted through the initialization power-supply wire 55 is passed via the source region SA, the channel region CA, and the drain region DA of the first TFT 57 and is further supplied to each of the gate electrodes GE1 and GE2 of the fourth TFT 60 through the second connection wire 65. Since the initialization signal has a potential that exceeds a threshold voltage of the fourth TFT 60, the fourth TFT 60 enters a driven state. At this point in time, the third connection wire 66 and the fourth connection wire 67 become electrically continuous. Thereafter, since an off signal is input to the sub gate wire 53 related to the nth pixel PX, the first TFT 57 related to the nth pixel PX enters an on state. Since the second TFT 58 is put into an on state, the initialization signal supplied to the second connection wire 65 is not supplied to the third connection wire 66. Also, and image signal is supplied to the source wire 227 related to the (n−1)th the pixel PX, and then a light-emission control signal is supplied to the EM wire 54 related to the (n−1)th pixel PX.

Next, scan signals are supplied to the gate wire 226 related to the nth pixel PX and the sub gate wire 53 related to the (n+1)th pixel PX (the subsequent one in the scan order) at the same timing. At this point in time, since the second TFT 58 and the third TFT 59 which are related to the nth pixel PX are driven, the source wire 227 and the fourth connection wire 67 become electrically continuous, and the third connection wire 66 and the second connection wire 65 become electrically continuous. When an image signal is supplied to the source wire 227 at this timing, the image signal is transmitted from the source wire 227 to the fourth connection wire 67. At this point in time, the fourth TFT 60 is driven based on the initialization signal supplied to each of the gate electrodes GE1 and GE2, and the potential of each of the gate electrodes GE1 and GE2 is held by an electrostatic capacitance 87 formed between the gate electrode GE2 of the fourth TFT 60 and the anode-side power-supply wire 56. Accordingly, the image signal transmitted to the fourth connection wire 67 is supplied to the third connection wire 66 via the source region SA, the channel region CA, and the drain region DA of the fourth TFT 60. The image signal transmitted to the third connection wire 66 is supplied to the second connection wire 65 via the source region SA, the channel region CA, and the drain region DA of the second TFT 58. The image signal transmitted to the second connection wire 65 is supplied to each of the gate electrodes GE1 and GE2 of the fourth TFT 60. The above-described electrostatic capacitance 87 holds each of the gate electrode GE1 and GE2 of the fourth TFT 60 at a potential according to the image signal. Thereafter, an off signal is input to the gate wire 226 related to the nth pixel PX. Also, the scan signal is supplied to the sub gate wire 53 related to (n+1)th the pixel PX, so that the seventh TFT 63 related to the nth pixel PX is driven, and thus, the sixth connection wire 69 and the seventh connection wire 70 become electrically continuous to the initialization power-supply wire 55. Thus, the anode-side electrode 52 related to the nth pixel PX reaches a potential according to the initialization signal.

Thereafter, a light-emission control signal is supplied to the EM wire 54 related to the nth pixel PX. Since the light-emission control signal has a potential that exceeds a threshold voltage of the fifth TFT 61 and the sixth TFT 62, the fifth TFT 61 and the sixth TFT 62 enter a driven state. At this point in time, the fourth connection wire 67 and the fifth connection wire 68 become electrically continuous, and the third connection wire 66 becomes electrically continuous to the sixth connection wire 69 and the seventh connection wire 70. Since the fifth connection wire 68 is connected to the anode-side power-supply wire 56, a power source signal transmitted to the anode-side power-supply wire 56 is supplied from the fifth connection wire 68 to the fourth connection wire 67 via the source region SA, the channel region CA, and the drain region DA of the fifth TFT 61. The power source signal transmitted to the fourth connection wire 67 is supplied to the third connection wire 66 via the source region SA, the channel region CA, and the drain region DA of the fourth TFT 60. At this point in time, the power source signal supplied to the third connection wire 66 reaches a potential of each of the gate electrodes GE1 and GE2 of the fourth TFT 60, that is, a potential based on the image signal supplied to the source wire 227. The power source signal adjusted to the potential based on the image signal supplied to the source wire 227, as described above, is supplied from the third connection wire 66 to the sixth connection wire 69 and the seventh connection wire 70 via the source region SA, the channel region CA, and the drain region DA of the sixth TFT 62 and is then supplied to the anode-side electrode 52. Thus, since the anode-side electrode 52 reaches the potential based on the image signal supplied to the source wire 227, the light-emitting layer in the organic EL device layer, the light-emitting layer being connected to the anode-side electrode 52, emits an amount of light which corresponds to the potential. Thereafter, when an off signal is input to the EM wire 54 related to the nth pixel PX, the fifth TFT 61 and the sixth TFT 62 enter an on state to stop the light emission of the light-emitting layer in the organic EL device layer. Accordingly, the light-emission period of the light-emitting layer becomes a period from when the light-emission control signal is input to the EM wire 54 related to the nth pixel PX until the off signal is input thereto. That is, by adjusting the timing at which the light-emission control signal and the off signal are input to the EM wire 54, it is possible to control the light-emission period and the non-light-emission period of the light-emitting layer.

Other Embodiments

The present invention is not limited to the embodiments described in conjunction with the above description and the drawings, and the technical scope of the present invention also include, for example, embodiments as described below.
(1) Relay wires can be arranged overlapping all the first source wires disposed in the first region, and the dummy wires can also be omitted.
(2) The second source wires may have a configuration in which the main source wire part and the sub source wire part are connected through a contact hole inside the display area and a contact hole outside the display region (a configuration obtained by combining the first and second embodiments).
(3) The relay wires may be disposed so as not to overlap the first source wires. Similarly, the dummy wires may be disposed so as not to overlap the first source wires. Also, the second source wires may be disposed so that the main source wire parts and the sub source wire parts do not overlap each other.
(4) The second source wires may be constituted by only the main source wire parts, and the sub source wire parts may be omitted. In this case, the dummy wires may be arranged overlapping the second source wires (the main source wire parts).
(5) The short-circuit wire that short-circuits the dummy wires may be disposed at only the driver side and may not be arranged at the opposite side to the driver side.
(6) The extended outer shape portion may be provided only at one side of the array substrate with respect to the X-axis direction.
(7) Each extended outer shape portion at the array substrate may include a portion having an arc shape (a curved line shape) so as to be depressed inwardly.

(8) Each extended outer shape portion on the array substrate may have a straight-line shape, a polygonal shape, or the like, other than the arc shape.

(9) the outer shape of the array substrate in plan view may be a trapezoid, a rhombus, a triangle, a polygon with five or more corners, a circle, an oval, or the like. Also, the outer shape of the array substrate may be a super horizontally long shape, such as a shape whose outer shape dimension in the horizontal direction (the direction in which the gate wires extend) is, for example, eight times or more larger than the outer shape dimension in the vertical direction (the direction in which the source wires extend).

(10) The gate circuit portion may be provided at only one side of the array substrate with respect to the X-axis direction.

(11) The gate circuit portions may be omitted from the array substrate, and a gate driver having functions that are similar to those of the gate circuit portions may be mounted on the array substrate.

(12) The stacking order of the films that constitute the liquid-crystal panel and that are stacked on the array substrate can be changed as appropriate. For example, the films may have a configuration in which a first metal film, a gate insulating film, a semiconductor film, a second metal film, a first interlayer insulating film, planarization film, a third metal film, a second interlayer insulating film, a first transparent electrode film, a third interlayer insulating film, and a second transparent electrode film are stacked in that order. In this case, the first metal film constitutes the gate wires, the gate electrodes of the TFTs, the short-circuit wires, and so on; the second metal film constitutes first source wires, the source electrodes and the drain electrodes of the TFTs, the main source wire parts of the second source wires, and so on; and the third metal film constitutes the relay wires, the sub source wire parts of the second source wires, the dummy wires, and so on.

(13) The number of slits formed in the pixel electrodes comprised by the liquid-crystal panel, the plane shape of the slits, and so on may be changed as appropriate.

(14) The slits can be formed in respective portions included in the common electrode and that overlap the pixel electrodes, without being formed in the pixel electrodes comprised by the liquid-crystal panel.

(15) In the liquid-crystal panel, the first transparent electrode film may constitute the pixel electrodes, and the second transparent electrode film may constitute the common electrodes.

(16) In the liquid-crystal panel, the TFTs may be a top-gate type or double-gate type.

(17) The display mode of the liquid-crystal panel may also be a TN mode, VA mode, IPS mode, or the like, other than the FFS mode.

(18) The liquid-crystal panel may also be a reflective liquid-crystal panel or a semi-transmissive liquid-crystal panel, other than a transmissive liquid-crystal panel.

(19) Each TFT in the organic EL display panel may be a top-gate type or bottom-gate type display panel.

(20) When the organic EL display panel has a configuration in which light emitted from the organic EL device layer exhibits specific colors (red, green, and blue), there are cases in which the pixels do not include color filters.

(21) The organic EL display panel may be, other than the top-emission type, a bottom-emission type in which light emitted from the light-emitting layer is output to the array substrate side.

(22) In the organic EL display panel, a specific circuit configuration for supplying signals to the anode-side electrodes can be changed as appropriate. For example, the number of TFTs that are placed can be changed to a number other than seven. Also, the specific plane shapes (routing shapes) of the anode-side power-supply wires and the anode-side electrodes, the specific plane shape of each connection wire, and so on can be changed as appropriate. Also, the specific arrangement order of the gate wires, the sub gate wires, the EM wires, and the initialization power-supply wires and the plane shapes thereof can be changed as appropriate. Also, which metal films are used for the sub gate wires, the EM wires, the initialization power-supply wires, and the anode-side power-supply wires may be changed as appropriate. Also, which reduced-resistance regions in the metal films and the semiconductor films are used for the respective connection wires can be changed as appropriate.

(23) The semiconductor films may be made of amorphous silicon or polysilicon (LTPS), other than the oxide semiconductor.

(24) The array substrate may be an array substrate comprised by another type of display panel (such as an EPD (a microcapsule-type electrophoresis-system display panel)) other than a liquid-crystal panel and an organic EL display panel.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a signal supply portion that supplies a signal;
a substrate having an extended outer shape portion whose width increases as a distance from the signal supply portion increases, the substrate including a first region and a second region that is disposed so as to be neighboring to the first region and that has the extended outer shape portion;
a display region that is disposed at the substrate so as to lie across the first region and the second region and that displays an image;
a first pixel disposed in the first region in the display region;
a second pixel disposed in the second region in the display region;
a first pixel wire disposed in the first region in the display region and connected to the first pixel and the signal supply portion;
a second pixel wire disposed in the second region in the display region and connected to the second pixel;
a relay wire disposed in the first region in the display region;
a signal-supply-portion-side lead wire connected to the signal supply portion and an end portion of the relay wire, the end portion being at the signal supply portion side; and
an opposite-side lead wire connected to end portions of the relay wire and the second pixel wire, the end portions being at an opposite side to the signal supply portion side.

2. The display device according to claim 1, wherein the relay wire is disposed so as to overlap the first pixel wire via an insulating film.

3. The display device according to claim 1, wherein the second pixel wire is constituted by a main pixel wire part and a sub pixel wire part, the main pixel wire part being connected to the second pixel, and the sub pixel wire part being disposed so as to overlap the main pixel wire part via an insulating film and being connected to the main pixel wire part.

4. The display device according to claim 3, wherein the first pixel wire is disposed in a same layer as a layer of the main pixel wire part, whereas the relay wire is disposed in a same layer as a layer of the sub pixel wire part and is disposed so as to overlap the first pixel wire via the insulating film.

5. The display device according to claim 3, wherein in the second pixel wire, end portions of the main pixel wire part and the sub pixel wire part are disposed outside the display region and are also connected to each other through a contact hole opened and formed in the insulating film.

6. The display device according to claim 3, wherein in the second pixel wire, portions of the main pixel wire part and the sub pixel wire part, the portions being neighboring to the second pixel, are connected to each other through a contact hole opened and formed in the insulating film.

7. The display device according to claim 6, wherein the second pixel wire has an increased-width part at a position where the main pixel wire part and the sub pixel wire part overlap the contact hole; and the first pixel wire has a dummy increased-width part whose width is same as a width of the increased-width part.

8. The display device according to claim 1, wherein the first region is segmented into a middle region that is neighboring to the second region and an opposite-side region that is disposed at an opposite side to the second region side so that the opposite-side region and the second region sandwich the middle region, and the relay wire is selectively disposed in the middle region.

9. The display device according to claim 8, wherein the relay wire is disposed so as to overlap the first pixel wire via an insulating film, and the display device comprises a dummy wire that is selectively disposed in the opposite-side region in the display region and that is disposed so as to overlap the first pixel wire via the insulating film.

10. The display device according to claim 9, wherein a constant potential is supplied to the dummy wire.

11. The display device according to claim 10, wherein the number of dummy wires disposed in the opposite-side region is two or more, and end portions of each dummy wire are disposed outside the display region; and the display device comprises a short-circuit wire that is positioned between the display region and an outer edge of the substrate, that is disposed so as to overlap respective end portions of the dummy wires via a second insulating film that includes at least a portion of the insulating film, and that is also connected to the dummy wires through short-circuit contact holes opened and formed in the second insulating film.

12. The display device according to claim 1, wherein the numbers of first pixel wires, second pixel wires, relay wires, signal-supply-portion-side lead wires, and opposite-side lead wires that are disposed are each two or more; and the opposite-side lead wires include first opposite-side lead wires and second opposite-side lead wires that are disposed in a layer different from the first opposite-side lead wires via an insulating film and that are disposed so as to be neighboring to the first opposite-side lead wires.

13. The display device according to claim 12, wherein the relay wires are disposed so as to overlap the first pixel wire via the insulating film; and the first opposite-side lead wires and the second opposite-side lead wires are disposed in same layers as layers of the relay wires and the first pixel wires, respectively.

14. The display device according to claim 12, wherein the numbers of second pixels that are disposed are two or more, the second pixel wires are constituted by main pixel wire parts and sub pixel wire parts, the main pixel wire parts being connected to the second pixels, and the sub pixel wire parts being disposed so as to overlap the main pixel wire parts via the insulating film and being connected to the main pixel wire parts; and the first opposite-side lead wires and the second opposite-side lead wires are disposed in same layers as layers of the sub pixel wire parts and the main pixel wire parts, respectively.

15. The display device according to claim 1, comprising: a pixel driving portion disposed at the substrate between the display region and an outer edge of the extended outer shape portion to drive the first pixel and the second pixel.

\* \* \* \* \*